(12) United States Patent
Kai et al.

(10) Patent No.: US 9,786,488 B2
(45) Date of Patent: Oct. 10, 2017

(54) LIQUID PROCESSING METHOD, MEMORY MEDIUM AND LIQUID PROCESSING APPARATUS

(71) Applicant: TOKYO ELECTRON LIMITED, Minato-ku (JP)

(72) Inventors: Akiko Kai, Koshi (JP); Takafumi Niwa, Koshi (JP); Shogo Takahashi, Koshi (JP); Hiroshi Nishihata, Koshi (JP); Yuichi Terashita, Koshi (JP); Teruhiko Kodama, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 169 days.

(21) Appl. No.: 14/870,609

(22) Filed: Sep. 30, 2015

(65) Prior Publication Data

US 2016/0096203 A1  Apr. 7, 2016

(30) Foreign Application Priority Data

Oct. 1, 2014 (JP) .................................. 2014-203176

(51) Int. Cl.
| | |
|---|---|
| *B08B 3/00* | (2006.01) |
| *H01L 21/02* | (2006.01) |
| *H01L 21/033* | (2006.01) |
| *H01L 21/311* | (2006.01) |

(Continued)

(52) U.S. Cl.
CPC ...... *H01L 21/0206* (2013.01); *H01L 21/0337* (2013.01); *H01L 21/31133* (2013.01); *H01L 21/31144* (2013.01); *H01L 21/6708* (2013.01); *H01L 21/68742* (2013.01)

(58) Field of Classification Search
None
See application file for complete search history.

(56) References Cited

U.S. PATENT DOCUMENTS

2011/0289795 A1* 12/2011 Ishibashi ........... H01L 21/02074
34/467

FOREIGN PATENT DOCUMENTS

| JP | 2001-053051 A | 2/2001 |
|---|---|---|
| JP | 2004-349501 A | 12/2004 |

(Continued)

*Primary Examiner* — Michael Kornakov
*Assistant Examiner* — Ryan Coleman
(74) *Attorney, Agent, or Firm* — Oblon, McClelland, Maier & Neustadt, L.L.P.

(57) ABSTRACT

A liquid processing method for liquid-processing a substrate includes setting a substrate on a substrate holding device which rotates the substrate such that the substrate is held in horizontal position, supplying processing liquid to center portion of the substrate such that the center portion positioned center side with respect to peripheral portion of the substrate is liquid-processed, positioning a discharge port of a processing liquid nozzle toward downstream side in rotation direction such that the liquid is discharged to the peripheral portion obliquely to surface of the substrate and along tangential direction of the substrate while the substrate is rotated, and discharging gas from a gas nozzle perpendicularly to the surface of the substrate toward position that is adjacent to liquid landing position of the liquid on the surface of the substrate and is on the center side of the substrate, while the liquid is discharged to the peripheral portion.

15 Claims, 15 Drawing Sheets

(51) Int. Cl.
*H01L 21/67* (2006.01)
*H01L 21/687* (2006.01)

(56) References Cited

FOREIGN PATENT DOCUMENTS

| | | |
|---|---|---|
| JP | 2013-140881 A | 7/2013 |
| JP | 2013-232621 A | 11/2013 |

* cited by examiner

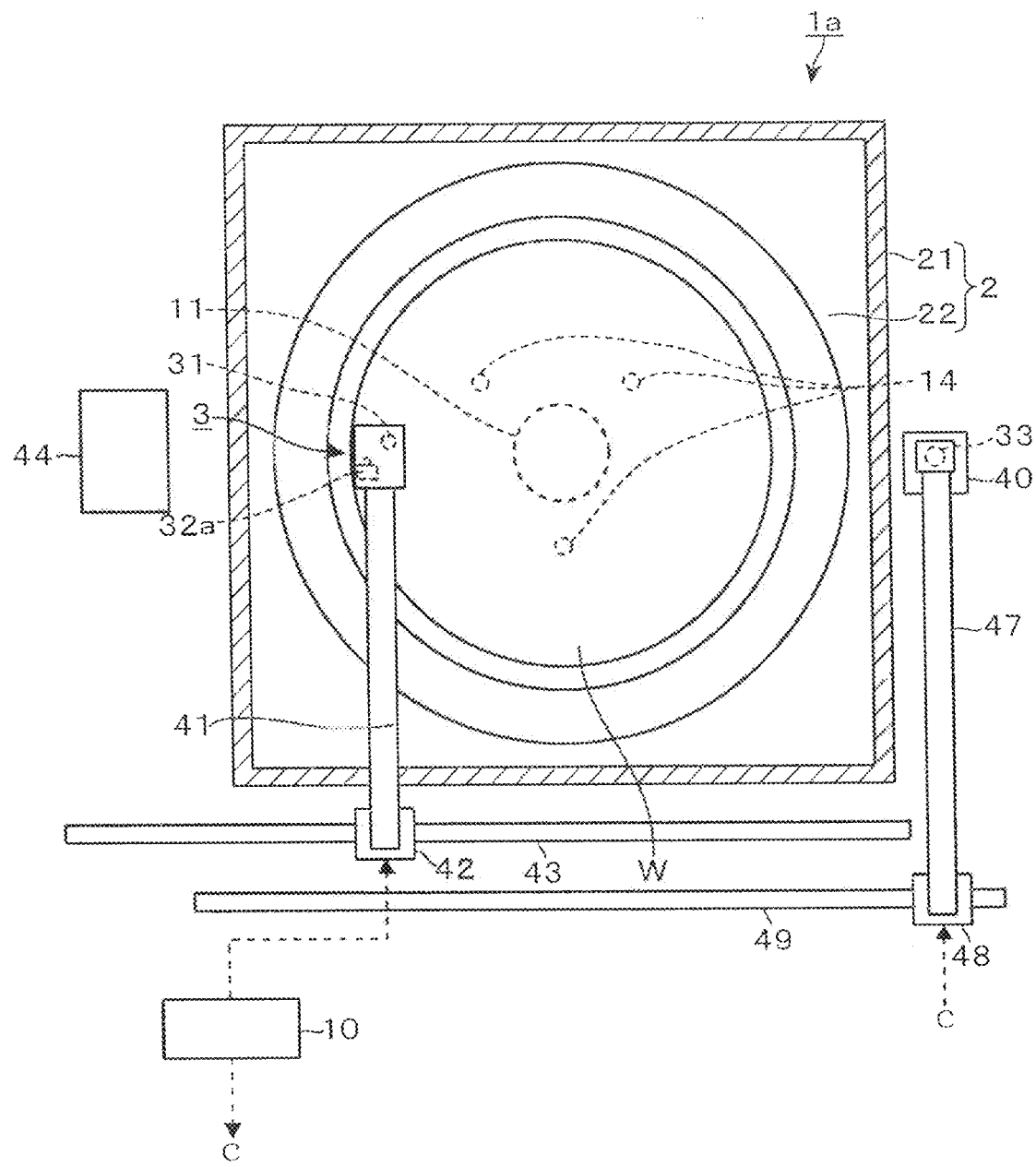

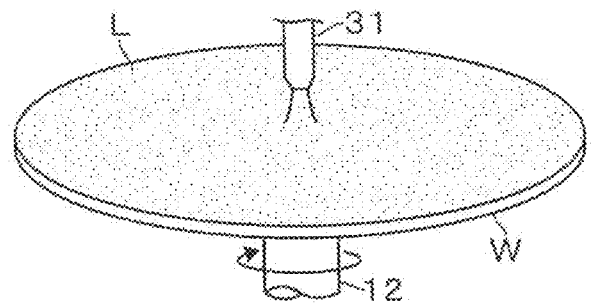
FIG. 12A
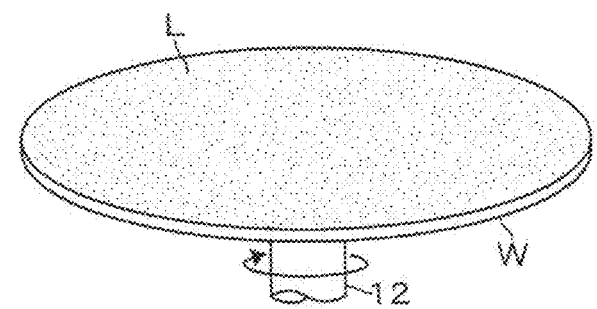
FIG. 12B
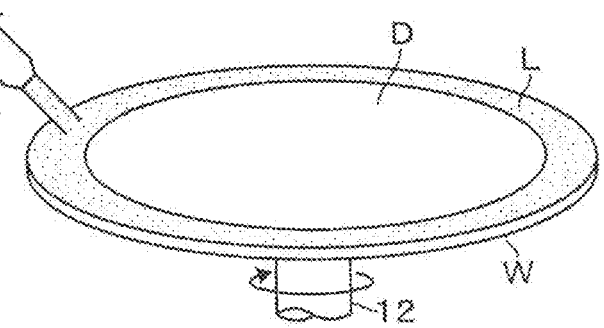
FIG. 12C
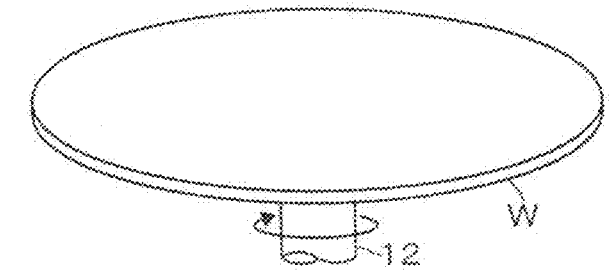
FIG. 12D 1000rpm 1300rpm 1600rpm

FIG. 14

| Flow Rate [ml/minute] | Flow Speed [m/second] | Nozzle Diameter [mm] | Angle Relative to Wafer Surface | | |
|---|---|---|---|---|---|
| | | | 20° | 30° | 45° |
| 10 | 2.5 | 0.3 | ○ | ○ | ○ |
| 15 | 3.5 | | ○ | ○ | X |
| 20 | 4.7 | | ○ | ○ | X |
| 30 | 7.1 | | ○ | ○ | X |
| 40 | 9.4 | | ○ | X | X |

FIG. 15

| Flow Rate [ml/minute] | Flow Speed [m/second] | Nozzle Diameter [mm] | Angle Relative to Wafer Surface | | |
|---|---|---|---|---|---|
| | | | 20° | 30° | 45° |
| 20 | 0.7 | 0.8 | X | X | X |
| 30 | 1.0 | | X | ○ | X |
| 50 | 1.7 | | X | ○ | X |
| 75 | 2.5 | | X | ○ | X |
| 107 | 3.5 | | X | X | X |

FIG. 16

| Rotation Speed [rpm] | Linear Speed [m/second] | Flow Rate [ml/minute] | | | | |
|---|---|---|---|---|---|---|
| | | 16 | 18 | 20 | 22 | 24 |
| | | 3.9 | 3.9 | 4.4 | 5.0 | 5.5 |
| 600 | 9.1 | X | ○ | ○ | ○ | ○ |
| 800 | 12.1 | ○ | ○ | ○ | ○ | ○ |
| 1000 | 15.2 | ○ | ○ | ○ | ○ | ○ |
| 1200 | 18.2 | ○ | ○ | ○ | ○ | ○ |
| 1400 | 21.3 | ○ | ○ | ○ | ○ | ○ |
| 1600 | 24.3 | ○ | ○ | ○ | ○ | ○ |
| 1800 | 27.3 | ○ | ○ | ○ | ○ | ○ |
| 2000 | 30.4 | ○ | ○ | ○ | ○ | ○ |
| 2200 | 33.4 | ○ | ○ | ○ | ○ | X |
| 2400 | 36.4 | ○ | ○ | ○ | ○ | X |
| 2600 | 39.5 | X | ○ | ○ | ○ | X |
| 2800 | 42.5 | X | X | X | X | X |
| 3000 | 45.6 | X | X | X | X | X |

Example 4-1

Comparative
Example 4-1

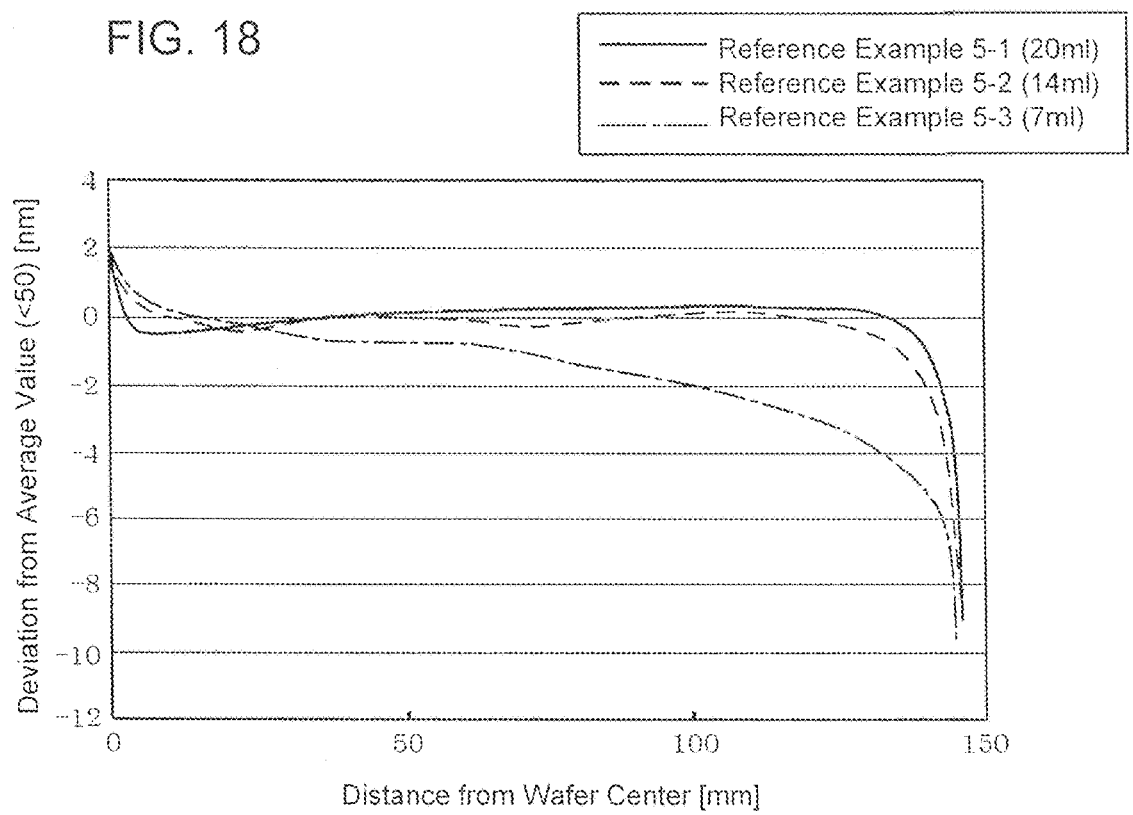

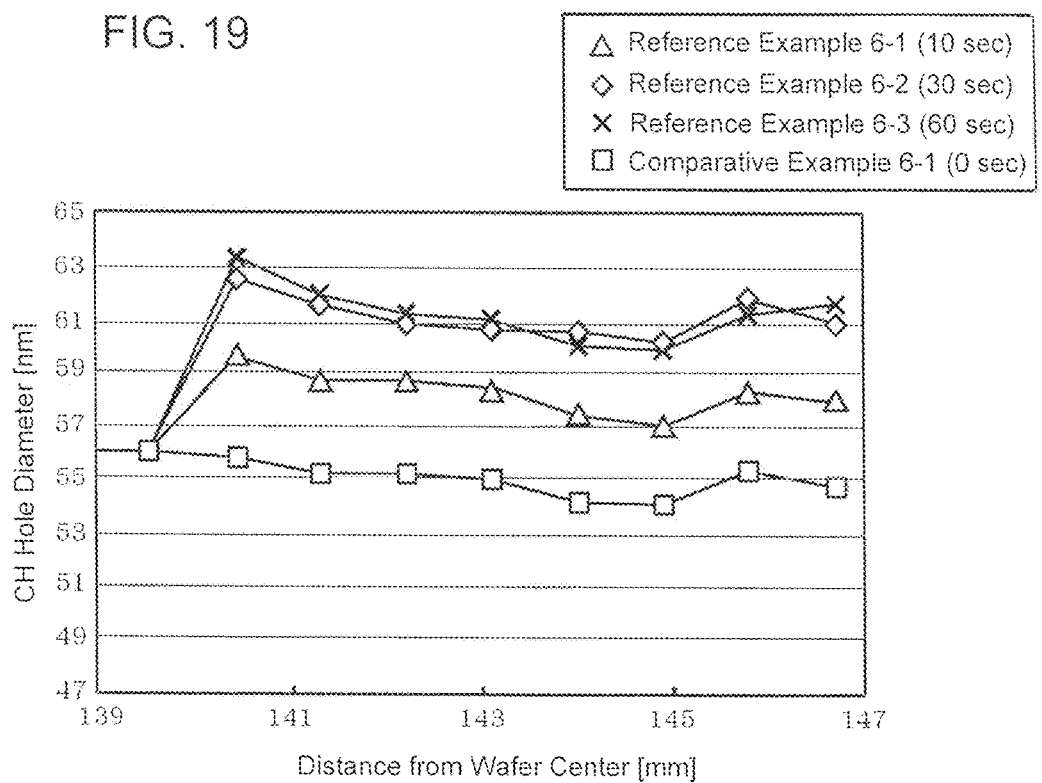

LIQUID PROCESSING METHOD, MEMORY MEDIUM AND LIQUID PROCESSING APPARATUS

CROSS-REFERENCE TO RELATED APPLICATIONS

The present application is based upon and claims the benefit of priority to Japanese Patent Application No. 2014-203176, filed Oct. 1, 2014, the entire contents of which are incorporated herein by reference.

BACKGROUND OF THE INVENTION

Field of the Invention

The present invention relates to a field of technology that performs liquid processing by supplying a processing liquid to a surface of a rotating substrate.

Description of Background Art

Japanese Patent Laid-Open Publication No. 2013-232621 describes a method in which a film of a copolymer of two kinds of polymers that is formed on a substrate is heated and the two polymers are phase-separated and subsequently, by irradiating the film with ultraviolet light, one of the polymers is made soluble in an organic solvent.

Japanese Patent Laid-Open Publication No. 2013-140881 describes that, after a liquid developer is supplied to a substrate, a surface of the substrate is cleaned by moving a gas nozzle and a cleaning liquid nozzle from a center side of the substrate to a periphery side of the substrate. Further, Japanese Patent Laid-Open Publication No. 2001-53051 describes that, in a state in which a gas nozzle and a pure water nozzle are inclined so as to oppose each other, the two nozzles are moved from a center side of a substrate to a periphery side of the substrate. The entire contents of these publications are incorporated herein by reference.

SUMMARY OF THE INVENTION

According to one aspect of the present invention, a liquid processing method for liquid-processing a substrate includes setting a substrate on a substrate holding device which rotates the substrate such that the substrate is held in a horizontal position, supplying a processing liquid to a center portion of the substrate such that the center portion positioned a center side with respect to a peripheral portion of the substrate is liquid-processed, positioning a discharge port of a processing liquid nozzle toward a downstream side in a rotation direction of the substrate such that the processing liquid is discharged to the peripheral portion of the substrate obliquely with respect to a surface of the substrate and along a tangential direction of the substrate while the substrate is rotated, and discharging a gas from a gas nozzle perpendicularly with respect to the surface of the substrate toward a position that is adjacent to a liquid landing position of the processing liquid on the surface of the substrate and is on the center side of the substrate, while the processing liquid is discharged to the peripheral portion of the substrate.

According to another aspect of the present invention, a liquid processing apparatus for liquid-processing a substrate includes a substrate holding device which holds and rotates a substrate in a horizontal position, a nozzle holding device holding a processing liquid nozzle and a gas nozzle, the processing liquid nozzle having a discharge port and structured to discharge a processing liquid from the discharge port such that the processing liquid is discharged obliquely with respect to a surface of the substrate, the gas nozzle structured to discharge a gas perpendicularly with respect to the surface of the substrate, a moving device which moves the nozzle holding device with respect to the surface of the substrate, and a control device having circuitry which controls the nozzle holding device, the substrate holding device and the moving device such that while the substrate is rotated, the processing liquid is discharged to a peripheral portion of the substrate toward a downstream side in a rotation direction of the substrate and along a tangential direction of the substrate and a gas is discharged from the gas nozzle toward a position that is adjacent to a liquid landing position of the processing liquid on the surface of the substrate and is on a center side of the substrate.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 11 is a plan view of the development apparatus;

FIG. 12A-12D are process diagrams of wafer processing using the development apparatus;

FIG. 14 is a first explanatory diagram illustrating results of a preliminary experiment;

FIG. 15 is a second explanatory diagram illustrating results of a preliminary experiment;

FIG. 16 is a third explanatory diagram illustrating results of a preliminary experiment;

FIG. 18 is an explanatory diagram illustrating a relation between a liquid developer supply amount and CH hole-diameter distribution; and FIG. 19 is an explanatory diagram illustrating a relation between a re-development time period and CH hole-diameter distribution.

DETAILED DESCRIPTION OF THE EMBODIMENTS

Figure 1:
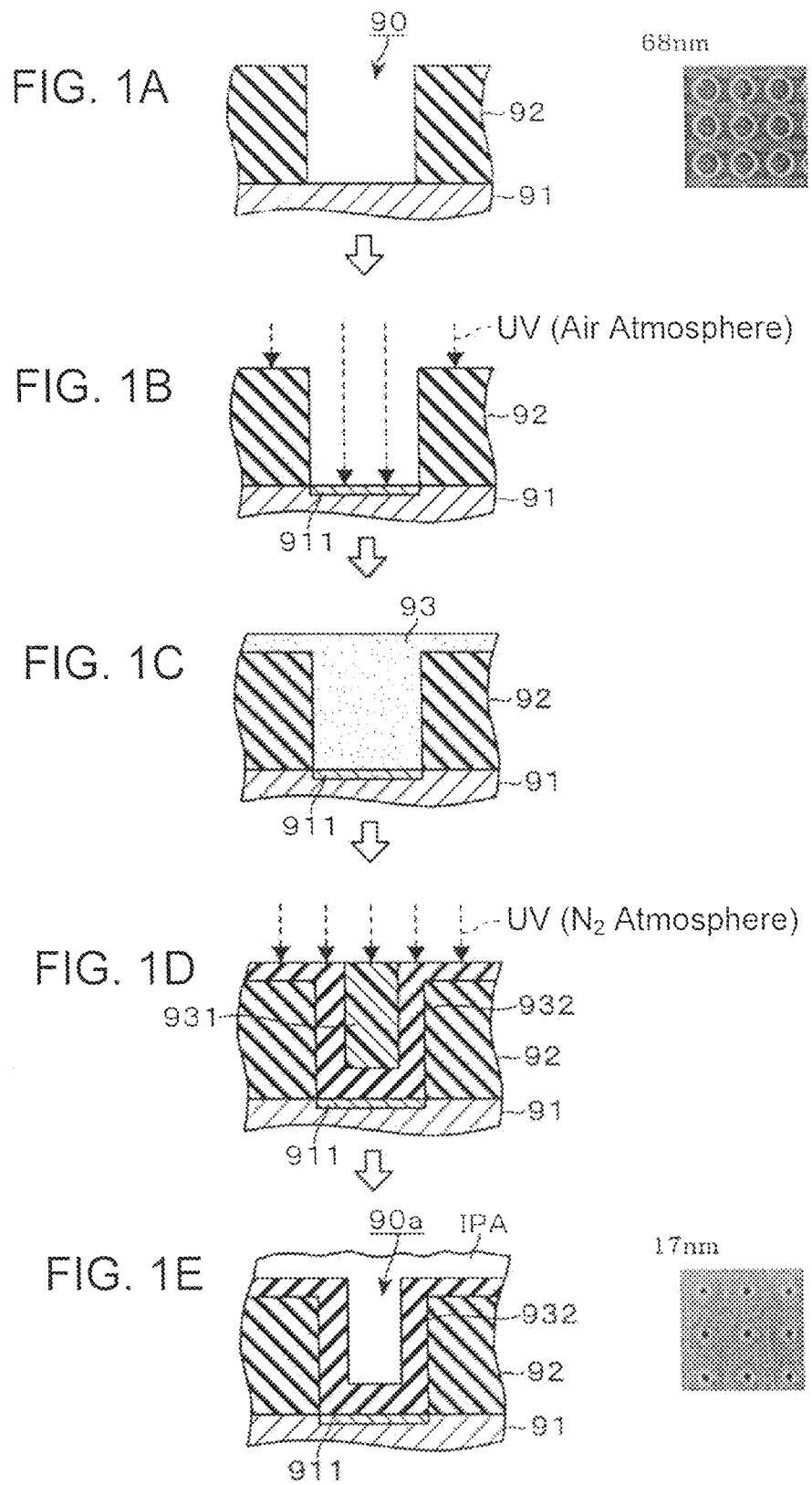
FIG. 1A-1E are process diagrams illustrating an example of a method in which DSA is used to form a pattern.

The embodiments will now be described with reference to the accompanying drawings, wherein like reference numerals designate corresponding or identical elements throughout the various drawings.

First Embodiment

First, a description is given of an example of a process that is executed with respect to a semiconductor wafer (W) (hereinafter, referred to as a "wafer (W)") that is a substrate, using a development apparatus 1 that is a liquid processing apparatus according to an embodiment of the present invention.

The development apparatus 1 is applied to a process in which a pattern that is formed on the wafer (W) is developed by using a directed self assembly (DSA) of block copolymers (BCP).

FIG. 1A-1E illustrate an example in which, on an inner side of an opening 90 that is formed in a resist film 92, a BCP that contains a hydrophilic polymer block and a hydrophobic polymer block is phase-separated, and a phase on a center side is removed using an organic solvent, and thereby a small-diameter opening (90a) is further formed.

FIG. 1A illustrates a state in which, on an upper surface side of the wafer (W) (not illustrated in FIG. 1A-1E), a neutral membrane 91 is formed having an intermediate affinity with respect to both a hydrophilic polymer part 931 and a hydrophobic polymer part 932 that are formed by phase-separating the BCP. Further, on an upper layer side of the neutral membrane 91, the resist film 92 is formed. In the resist film 92, in accordance with a position of a contact hole provided in the wafer (W), the column-shaped opening 90 is patterned by exposure and development. With respect to the wafer (W), the contact hole is formed using the opening 90.

When a UV treatment is performed in an air atmosphere with respect to the wafer (W), a hydrophilic region 911 is formed on a surface of the resist film 92 and on a surface of the neutral membrane 91 (FIG. 1B; for convenience, in FIG. 1B-1E, only the hydrophilic region 911 formed on the surface of the neutral membrane 91 is illustrated). After the hydrophilic region 911 is formed, BCP is applied on the resist film 92 to form a BCP film 93 (FIG. 1C). Next, a heat treatment is performed by heating the wafer (W) on which the BCP film 93 is formed. By the heat treatment, the hydrophilic polymer block and the hydrophobic polymer block of the BCP film 93 are phase-separated in the opening 90, and the hydrophilic polymer part 931 and the hydrophobic polymer part 932 are formed. Among the polymer parts (931, 932), the hydrophilic polymer part 931 is formed in a columnar shape at a center part in the opening 90, and the hydrophobic polymer part 932 is formed in a cylindrical shape between the hydrophilic region 911 that is formed by the above UV treatment and the hydrophilic polymer part 931.

When a UV treatment is further performed in a nitrogen gas atmosphere with respect to the wafer (W) on which the hydrophilic polymer part 931 and the hydrophobic polymer part 932 are formed (FIG. 1D), for example, the hydrophobic polymer part 932 undergoes a cross-linking reaction and becomes less soluble in a solvent, whereas the hydrophilic polymer part 931 undergoes a reaction in which a main chain of the polymer is cut and becomes easy to be dissolved in the solvent. Thereafter, development processing is performed in which an organic solvent such as IPA (isopropyl alcohol) is supplied to the surface of the wafer (W) to dissolve and remove the hydrophilic polymer part 931, and thereby, the inner side of the opening 90 is covered by the hydrophobic polymer part 932 and the small-diameter opening (90a) is exposed on the inner side of the hydrophobic polymer part 932 (FIG. 1E).

As a result, from the openings 90 that are illustrated on a right side in FIG. 1A having an average diameter of 68 nm, the openings (90a) illustrated on a right side in FIG. 1E having an average diameter of 17 nm are formed. By performing an etching process using the resist film 92 and the hydrophobic polymer part 932, in which the openings (90a) are formed, as a mask pattern, contact holes corresponding to the mask pattern can be formed on the wafer (W).

The type of the pattern that is formed using the DSA is not limited a cylindrical opening for forming a contact hole. For example, it is also possible that a line pattern or the like is formed using a lamellar structure that is formed by phase-separating the hydrophilic polymer part 931 and the hydrophobic polymer part 932.

The development apparatus 1 of the present example executes the above-described development processing in which IPA is used. In the following, based on FIG. 2-6, a structure of the development apparatus 1 is described.

In the development apparatus 1, by a heat treatment, the BCP film 93 is phase-separated into the hydrophilic polymer part 931 and the hydrophobic polymer part 932, and the wafer (W) after being subjected to a UV treatment in a nitrogen atmosphere is carried and the development processing using IPA is performed.

As illustrated in FIGS. 1A-1E and 2, the development apparatus 1 includes a spin chuck 11 that is a substrate holding device. The spin chuck 11 sticks to a center part on a back side of the wafer (W) and horizontally holds the wafer (W). Further, the spin chuck 11 is connected via a rotation shaft 12 to a rotation drive device (rotation mechanism) 13 provided on a lower side.

In the development apparatus 1, a cup body 2 is provided so as to surround the wafer (W) that is held by the spin chuck 11. The cup body 2 includes an outer cup 21 and an inner cup 22. An upper side of the cup body 2 is open. An upper side of the outer cup 21 is in a quadrangular shape, and a lower side of the outer cup 21 is in a cylindrical shape. A step part 23 is provided on a lower side of the outer cup 21. A lifting device 24 for lifting and lowering the outer cup 21 is connected to the step part 23. The inner cup 22 is in a cylindrical shape. An upper side of the inner cup 22 is inwardly inclined. When the outer cup 21 is lifted, a lower end surface of the inner cup 22 comes into contact with the step part 23, and thereby, the inner cup 22 is pushed upward. As a result, when a liquid developer is removed from the wafer (W), as illustrated by dashed lines in FIG. 2, the cup body 2 (including the outer cup 21 and the inner cup 22) is lifted and can receive liquid scattered from the wafer (W).

A circular plate 25 is provided on a lower side of the wafer (W) that is held by the spin chuck 11. A ring-shaped guide member 26 having a mountain-like vertical cross-sectional shape is provided on an outer side of the circular plate 25. The guide member 26 guides a liquid developer or a rinse liquid (cleaning liquid) dropped out from the wafer (W) to a liquid receiving part 27 that is an annular recess provided on an outer side of the circular plate 25. A drain pipe 28 through which gas and liquid in the liquid receiving part 27 is discharged is connected to a bottom surface of the liquid receiving part 27. Gas-liquid separation is performed via a gas-liquid separator (not illustrated in the drawings) that is provided on a downstream side of the drain pipe 28. Drainage after the gas-liquid separation is collected into a drain tank (not illustrated in the drawings).

A pin 14 that is connected to a lift mechanism 15 is positioned on a lower side of the wafer (W) that is held by the spin chuck 11. The pin 14 is lifted or lowered between a position on an upper side and a position on a lower side of a holding plane on which the wafer (W) is held by the spin chuck 11, and executes delivery of the wafer (W) between a substrate carrying mechanism (not illustrated in the drawings) and the spin chuck 11.

The development apparatus 1 includes an IPA nozzle 32 that is a processing liquid nozzle for performing development processing in which IPA, which is a liquid developer, is supplied to the wafer (W) and the hydrophilic polymer part 931 is removed. In the development apparatus 1, a rinse treatment (cleaning treatment) is performed in which a dissolution product of the hydrophilic polymer part 931 that is dissolved in IPA during the development processing is washed away from the surface of the wafer (W). In the rinse treatment, IPA is used as a rinse liquid, the IPA having a smaller surface tension than pure water that is used in a rinse treatment. The IPA nozzle 32 supplies IPA to the wafer (W) during the rinse treatment. By using IPA or butyl acetate (to be described later) as a rinse liquid, development defects can be reduced and the time required for the rinse treatment can be shortened. However, this is not to deny performing a rinse treatment using pure water. It is also possible that DIW (Deionized Water), which is pure water, or a rinse liquid obtained by adding a surfactant to DIW, is used.

In the above-described rinse treatment, in order to prevent that a dissolution product remains on the surface of the wafer (W) after the rinse treatment or that water dissolved in IPA remains on the wafer (W) and forms a watermark, the development apparatus 1 of the present example performs rinsing while blowing an inert gas such as a nitrogen gas to the surface of the wafer (W). Therefore, the development apparatus 1 includes a nitrogen gas nozzle 31 that supplies a nitrogen gas to the wafer (W) during the rinse treatment.

When IPA having a small surface tension is used as a rinse liquid, as described in the background art, there is a problem that a development defect occurs caused by that a dissolution product or the like that is contained in a tail of a liquid film of the rinse liquid remains on the wafer (W). Therefore, in order to shorten the tail, it is required that the wafer (W) be rotated at a high speed. On the other hand, in the case where the wafer (W) is rotated at a high speed, when IPA supplied from the IPA nozzle 32 lands on the wafer (W), liquid splashing occurs and IPA re-lands on a region where the rinse treatment has been performed, and this is a factor causing contamination in this region.

The IPA nozzle 32 and the nitrogen gas nozzle 31 that are provided in the development apparatus 1 of the present example are structured to allow development defects to be reduced by performing the rinse treatment with the wafer (W) being rotated at a high speed while suppressing the occurrence of liquid splashing. In the following, structures of the IPA nozzle 32 and the nitrogen gas nozzle 31 are described.

Figure 4:
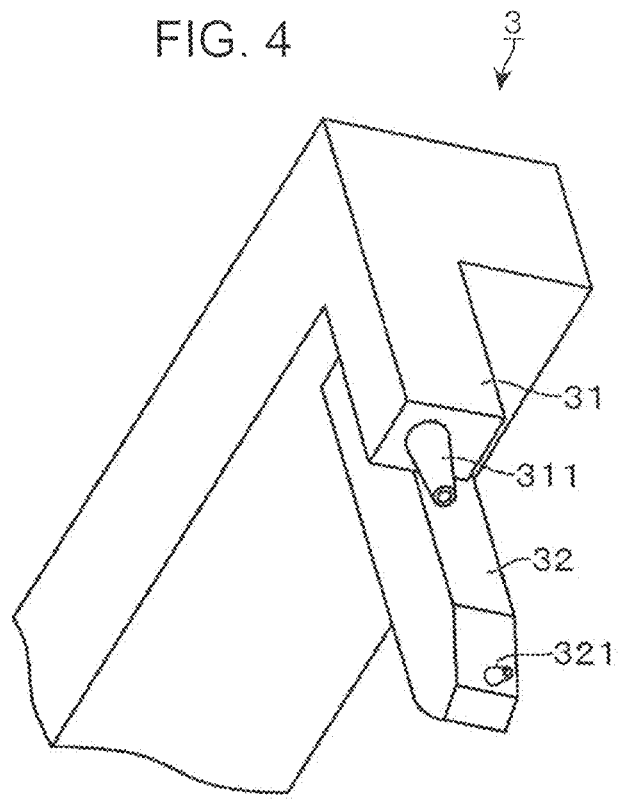
FIG. 4 is an enlarged perspective view of a nozzle head provided in the development apparatus.
Figure 5:
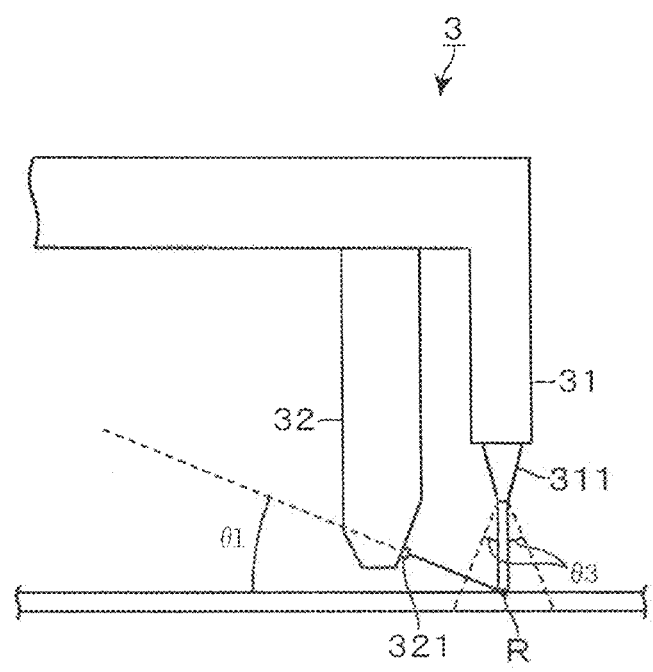
FIG. 5 is a side view of the nozzle head.

As illustrated in FIGS. 4 and 5, in the present example, the IPA nozzle 32 and the nitrogen gas nozzle 31 are provided on a common nozzle head 3 that is a nozzle holding device.

The IPA nozzle 32 is provided so as to extend downward from a lower side of the nozzle head 3. As illustrated in FIG. 5, a discharge port 321 of the IPA nozzle 32 is provided such that IPA, which is a liquid developer and a rinse liquid (processing liquid), is discharged obliquely downward with respect to the wafer (W) that is horizontally held by the spin chuck 11. An angle (θ1) formed by the IPA discharged from the discharge port 321 and the surface of the wafer (W) is set to be in a range of 15-30 degrees and is more preferably set to be 20 degrees.

Figure 6:
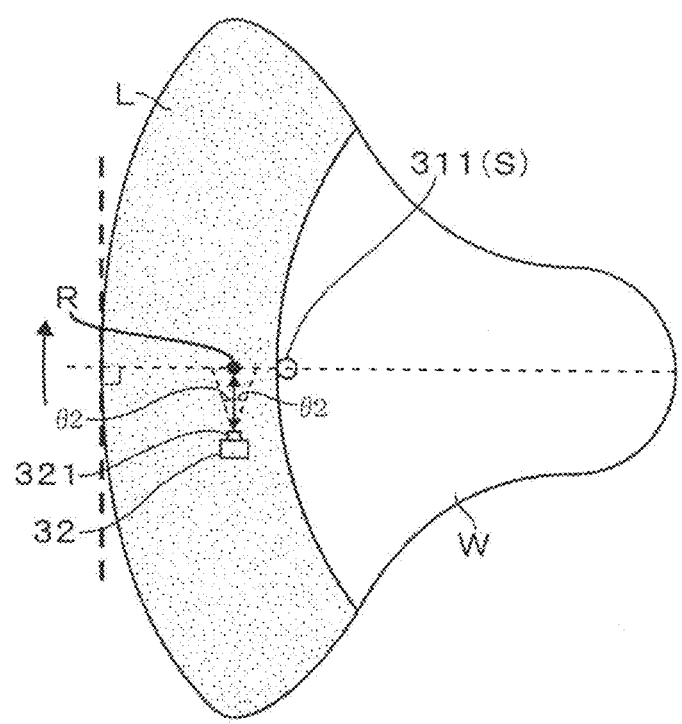
FIG. 6 is a plan view illustrating positioning of nozzles provided on the nozzle head.

FIG. 6 illustrates a discharge direction of the IPA from the discharge port 321 viewed from an upper side of the wafer (W). As illustrated in FIG. 6, the discharge port 321 of the IPA nozzle 32 discharges IPA toward a downstream side in the rotation direction of the wafer (W) along a tangential direction (illustrated by a thick dashed line in FIG. 6) of the wafer (W). Here, "along a tangential direction of the wafer (W)" also includes a case where an angle (θ2) formed by the tangential direction and the discharge direction of the IPA is 0±10 degrees. More preferably, the angle (θ2) is set to be 0 degree.

An opening diameter of the discharge port 321 is set to be 0.3 mm in a range of 0.25-0.35 mm. A height position (height distance from the surface of the wafer (W)) at which IPA is discharged from the discharge port 321 is 5 mm in a range of 3-7 mm.

As illustrated in FIGS. 4 and 5, the nitrogen gas nozzle 31 is provided so as to extend downward from the lower side of the nozzle head 3 at a position on a more front side of the nozzle head 3 than the IPA nozzle 32. In the nitrogen gas nozzle 31, a discharge port 311 is formed such that a nitrogen gas is discharged downward in a vertical direction. Here, "downward in a vertical direction" includes a case where an angle (θ3) formed by a line of flow of the nitrogen gas discharged from the discharge port 311 and a vertical line perpendicular to the surface of the wafer (W) is in a range of 0±5 degrees. More preferably, the angle (θ3) is set to be 0 degree.

As illustrated in the plan view of FIG. 6, a position at which the IPA that is discharged obliquely downward from the discharge port 321 of the IPA nozzle 32 reaches the surface of the wafer (W) is referred to as a liquid landing position (R). In this case, the nitrogen gas nozzle 31 is positioned such that an arrival position (S), on the surface of the wafer (W), of the nitrogen gas discharged from the discharge port 311 is positioned adjacent to the liquid landing position (R) on the center side in a radial direction of the wafer (W). A distance between the liquid landing position (R) of the IPA and the arrival position (S) of the nitrogen gas is set to be, for example, 13 mm in a range of 10-16 mm.

Further, an opening diameter of the discharge port 311 is set to be 2.0 mm in a range of 1.5-2.5 mm. A height position (height distance from the surface of the wafer (W)) at which the nitrogen gas is discharged from the discharge port 311 is 16 mm in a range of 10-20 mm.

Figure 2:
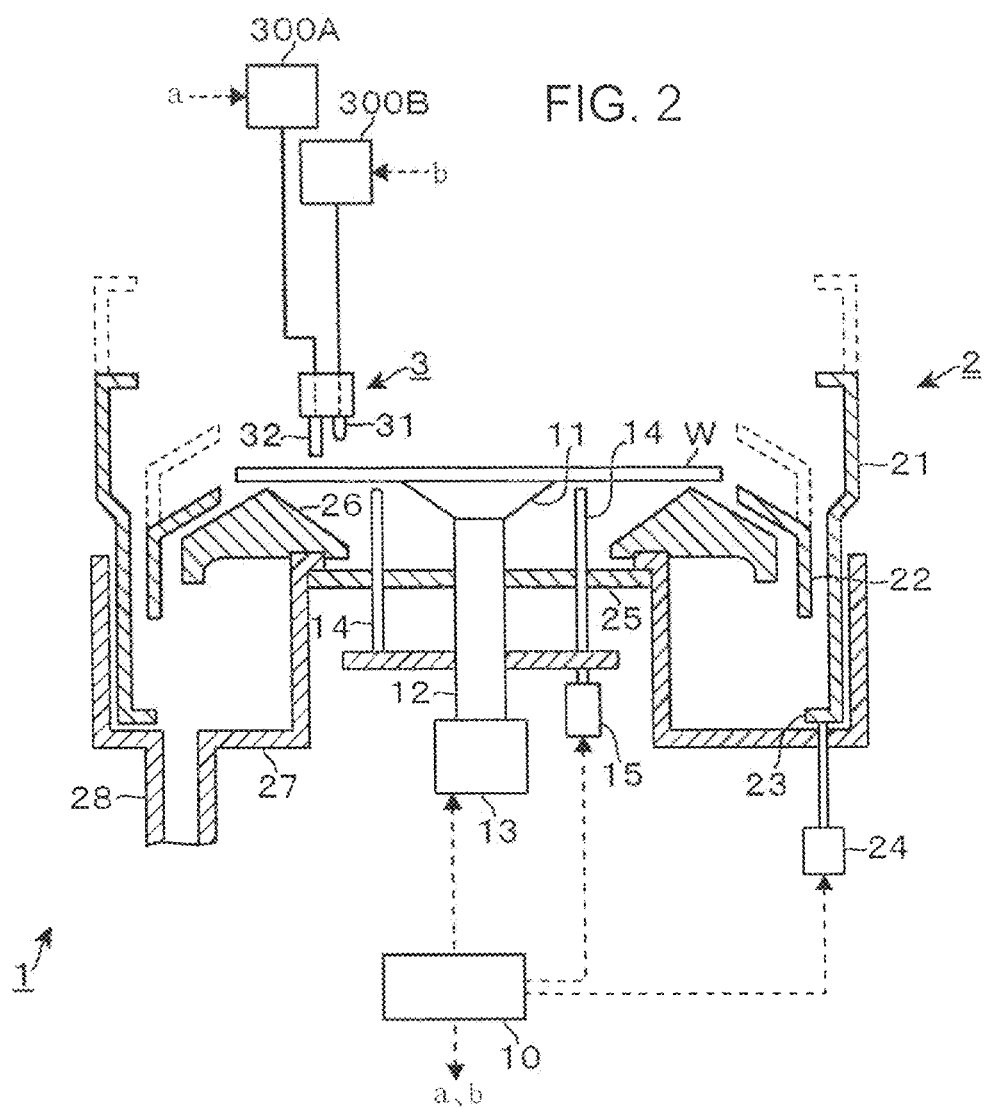
FIG. 2 is a vertical cross-sectional side view of a development apparatus according to a first embodiment.

As illustrated in FIG. 2, the IPA nozzle 32 is connected to an IPA supply source (300A) that is provided with a pump, a valve and the like. Further, the nitrogen gas nozzle 31 is connected to a nitrogen gas supply source (300B).

Figure 3:
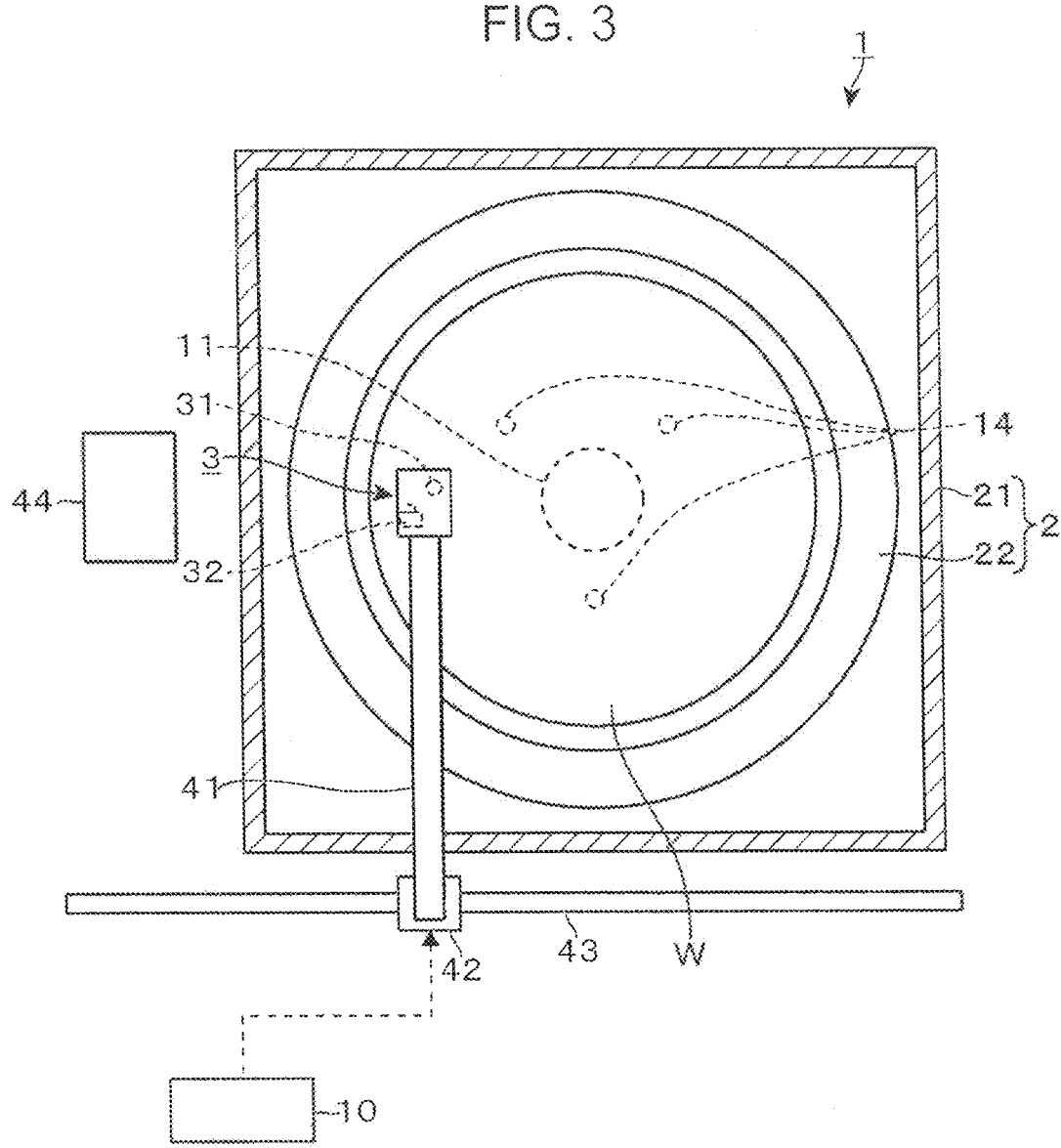
FIG. 3 is a plan view of the development apparatus.

Further, as illustrated in FIG. 3, the nozzle head 3 is provided on a front end part of an arm 41, and a nozzle drive device 42 is connected to a base end side of the arm 41. The nozzle drive device 42 has a function of lifting and lowering the arm 41 and a function of moving the arm 41 along a guide rail 43 that horizontally extends. The nozzle drive device 42 is structured as a moving mechanism that moves the nozzle head 3 along the radial direction of the wafer (W) that is held by the spin chuck 11. Further, on an outer side of the cup body 2, a standby region 44 is provided that is structured to freely engage the nozzle head 3 and includes a nozzle bath having a drain port.

In the development apparatus 1 having the above-described structure, a controller 10 that includes a computer is provided. The controller 10 includes a program storage (not illustrated in the drawings). In the program storage, a program is stored in which processes are organized such that the development processing (to be described later when operation is described) is executed. Based on the program, the controller 10 outputs a control signal to each device of the development apparatus 1 and controls operations such as the movement of the nozzle head 3 by the nozzle drive device 42, supplying IPA from the IPA supply source (300A) to the IPA nozzle 32, supplying nitrogen gas from the nitrogen gas supply source (300B) to the nitrogen gas nozzle 31, rotation of the wafer (W) by the spin chuck 11, and lifting and lowering the pin 14. The program storage is structured as a memory medium such as a hard disk, a compact disc, a magneto-optical disk or a memory card.

Here, in the rinse treatment in which IPA that is a rinse liquid is supplied to the wafer (W) after development, the controller 10 performs control in which, in accordance with a position in the radial direction of the wafer (W) at which IPA is supplied from the IPA nozzle 32, a rotational speed at which the rotation drive device 13 rotates the wafer (W) is varied and a linear speed (circumferential speed) in the tangential direction at the liquid landing position (R) of the IPA is kept constant in terms of calculation. In the present example, in a case where IPA is discharged from the IPA nozzle 32 to the wafer (W) while the nozzle head 3 is moved at a speed of 4 mm/second from the center side of the wafer (W) toward the periphery side of the wafer (W), the rotational speed of the wafer (W) is varied from 2500 rpm (on the center side) to 1800 rpm (on the periphery side) as the nozzle head 3 is moved from the center side to the periphery side such that the linear speed is kept constant (for example, at 30.4 m/second in a range of 12-36 m/second).

The operation of the above-described development apparatus 1 is described with reference to FIG. 7A-7D. First, after a BCP film 93 is formed and a heat treatment is performed, the wafer (W) after being subjected to a UV treatment in a nitrogen atmosphere is carried into the development apparatus 1 by an external substrate carrying mechanism and is placed on the spin chuck 11. Next, the nozzle head 3 is moved from the standby region 44 to the wafer (W) side such that the liquid landing position (R) of the IPA from the IPA nozzle 32 coincides with the center part of the wafer (W).

Figure 7A:
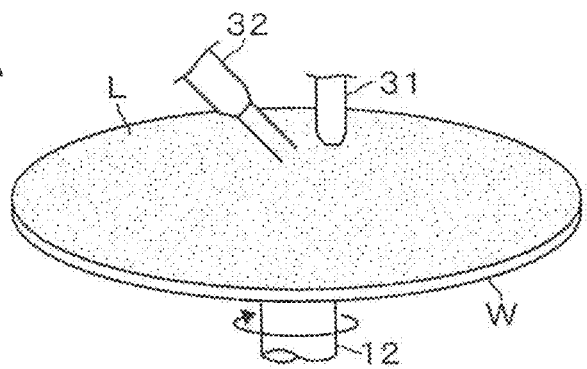
FIG. 7A-7D are process diagrams of wafer processing using the nozzle head.

Then, the rotational speed of the wafer (W) is adjusted to 2500 rpm in a range of 2000-3000 rpm; IPA is supplied at a supply flow rate of 18 ml/minute in a range of 10-50 ml/minute from the IPA nozzle 32 to the center part of the wafer (W); and the surface of the wafer (W) is covered by a liquid film (L) of the IPA (FIG. 7A). As a result, as described using FIG. 1E, the hydrophilic polymer part 931 is dissolved and removed by the IPA, and the development processing of the wafer (W) is performed.

Once the development processing has been performed for a predetermined period of time, the rotational speed of the wafer (W) is adjusted to 2500 rpm at the start of a rinse treatment, and a discharge flow rate of the IPA from the IPA nozzle 32 is adjusted to 20 ml/minute in a range of 16-24 ml/minute. Next, the nozzle head 3 is moved toward the periphery side (left-hand side as viewed from a bade end side of the nozzle head 3). Then, when the nitrogen gas nozzle 31 that is positioned behind the IPA nozzle 32 as viewed from a moving direction of the nozzle head 3 reaches a position above the center part of the wafer (W), supply of a nitrogen gas from the nitrogen gas nozzle 31 to the wafer (W) starts at a flow rate of 5 L/minute in a range of 3-7 L/minute (in standard conditions of 0° C. and 1 atm; the same applies hereinafter).

When an alkaline liquid developer containing sodium hydroxide, amine and the like is used as a liquid developer and when DIW or DIW with a surfactant added thereto is used as a rinse liquid, the discharge flow rate of these processing liquids from the nozzle 32 is adjusted to a range of 10-50 ml/minute, for example.

Figure 7B:
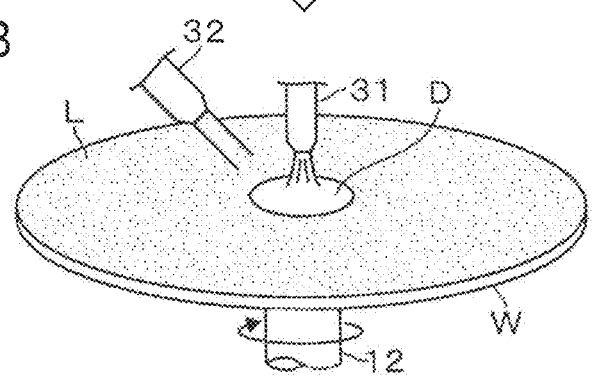
Figure 7C:
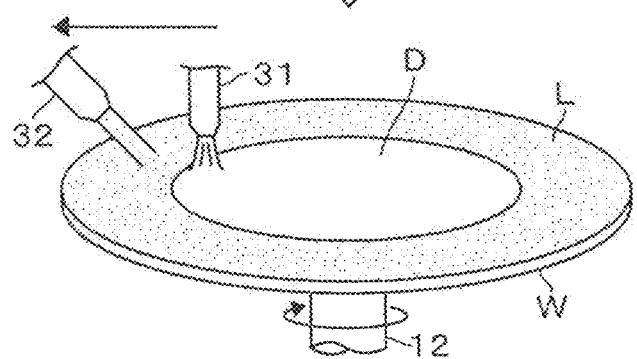

When a nitrogen gas is supplied from the nitrogen gas nozzle 31 to the center part of the wafer (W), a dry region (D) where the IPA is dried is formed around the arrival position (S) of the nitrogen gas (FIG. 7B). Once the dry region (D) is formed, while the supply of the IPA from the IPA nozzle 32 and the supply of the nitrogen gas from the nitrogen gas nozzle 31 are continued, the nozzle head 3 is moved toward the periphery side of the substrate at a moving speed of 4 mm/second in a range of 2-10 mm/s. In this case, as the liquid landing position (R) of the IPA is moved in the radial direction of the wafer (W), the rotation drive device 13 gradually reduces the rotational speed of the wafer (W) from 2500 rpm to 2000 rpm such that the linear speed of the wafer (W) in the tangential direction at the liquid landing position (R) of the IPA is 30.4 m/second. For example, when the above-described alkaline liquid developer is used as a liquid developer and when DIW or DIW with a surfactant added thereto is used as a rinse liquid, the moving speed of the nozzle head 3 is adjusted to within a range of 2-30 mm/s.

As a result, the rinse treatment in which a dissolution product that is generated during development is removed by the IPA that is supplied from the IPA nozzle 32, and the treatment in which the liquid film (L) of the wafer (W) is swept away by the nitrogen gas that is supplied from the nitrogen gas nozzle 31, are executed in parallel. Then, on the surface of the wafer (W) after the nozzle head 3 has passed, the dry region (D) after these treatments have been executed gradually spreads from the center side of the wafer (W) toward the periphery side of the wafer (D).

Figure 9:
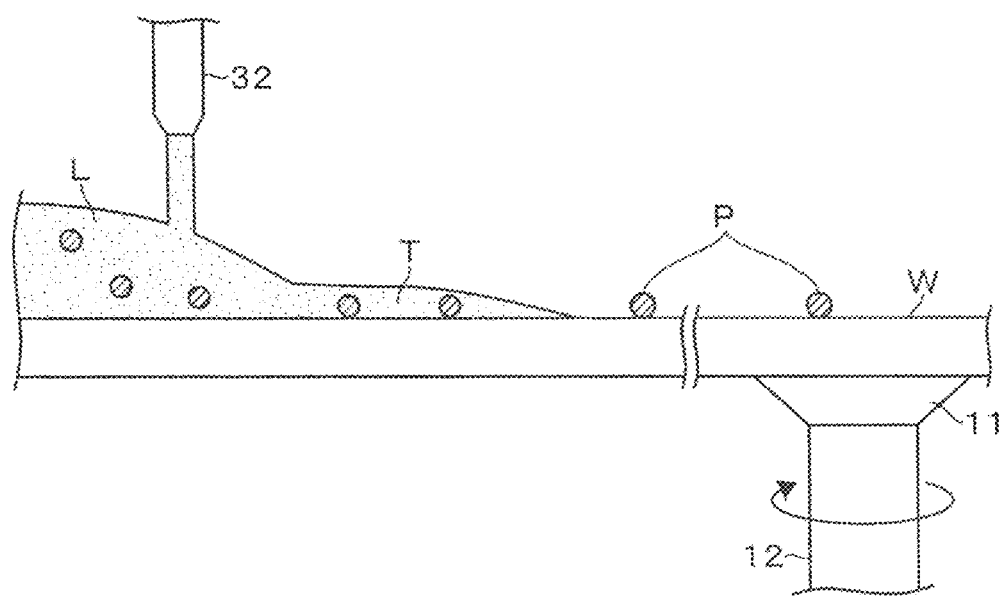
FIG. 9 is a schematic diagram of a rinse treatment using a conventional nozzle.

For example, when rinsing is performed using IPA having a small surface tension, as illustrated in FIG. 9, tail (T) that is a thinner liquid film is formed on an inner periphery side of the liquid film (L). When a dissolution product (P) generated during the development remains in the tail (T), a force to sweep away the dissolution product (P) is reduced, and the dissolution product (P) remains on the wafer (W) and causes occurrence of a development defect.

The supply of the nitrogen gas from the nitrogen gas nozzle 31 is for sweeping away the liquid film (L) that contains the dissolution product (P). However, when the nitrogen gas is blown to the tail (T) of the highly volatile IPA, the tail (T) is volatilized, and there is a risk that a dissolution product (P) remains at an unintended place.

Further, when the rotational speed of the wafer (W) is increased in order to shorten the tail (T), the larger is the rotational speed, the more significant is the problem of liquid splashing when the IPA lands on the wafer (W).

Therefore, in the development apparatus 1 of the present example, by discharging the IPA obliquely downward toward the downstream side in the rotation direction of the wafer (W) and along the tangential direction wafer (W), occurrence of liquid splashing of the IPA supplied to the wafer (W) that rotates at a high speed is suppressed (see experimental results described below).

Figure 8:
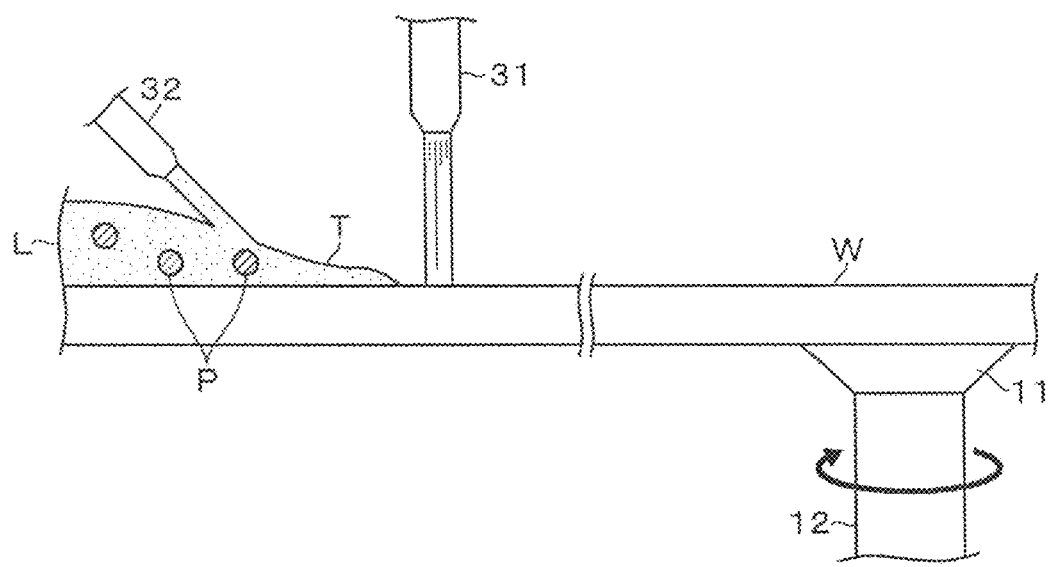
FIG. 8 is a schematic diagram of a rinse treatment using the nozzle head.

As a result, as schematically illustrated in FIG. 8, in a state in which the tail (T) is shortened by the high-speed rotation of the wafer (W), when nitrogen gas is supplied from the nitrogen gas nozzle 31, the liquid film (L) of the IPA, together with the dissolution product (P), is swept away toward the periphery side of the wafer (W), and a rinse treatment result that development defects are reduced can be obtained.

Figure 7D:
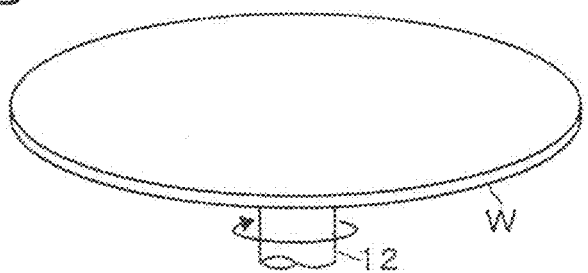

Returning to the description of the processing of the wafer (W), the nozzle head 3 reaches the periphery side of the wafer (W) and the rinse treatment is completed. The nozzle head 3 is further moved to a lateral side of the wafer (W), and the entire surface of the wafer (W) becomes the dry region (D). Thereafter, discharging of the IPA from the IPA nozzle 32 and discharging of the nitrogen gas from the nitrogen gas nozzle 31 are stopped, and the nozzle head 3 is moved to the standby region 44. The wafer (W) is further rotated at a rotational speed in a range of 1000-2500 rpm to remove IPA and water adsorbed on the surface of the wafer (W), and a dried wafer (W) is obtained (FIG. 7D).

The wafer (W) that has undergone the development processing and the rinse treatment as described above is taken out from the development apparatus 1 and is carried toward, for example, an etching apparatus of subsequent stage, by the external substrate carrying mechanism.

According to the development apparatus 1 of the present embodiment, the following effects can be achieved. When the IPA nozzle 32 and the nitrogen gas nozzle 31 are used to perform the rinse treatment using IPA, which is a rinse liquid, with respect to the surface of the wafer (W) while the wafer (W) is rotated, attention is focused on the discharge direction of the IPA from the IPA nozzle 32, the liquid landing position (R) of the rinse liquid, and the arrival position (S) of the nitrogen gas from the nitrogen gas nozzle 31, and positional relations between the discharge direction of the IPA, the liquid landing position (R) of the rinse liquid and the arrival position (S) of the nitrogen gas are adjusted. Therefore, even when the rotational speed of the wafer (W) is increased, liquid splashing of the IPA can be suppressed, and a good rinse treatment for the wafer (W) can be performed.

Here, the rinse liquid that is used when the wafer (W) that has undergone the development processing is subjected to the rinse treatment is not limited to IPA. Other organic solvents such as butyl acetate and MIBC (methyl isobutyl carbinol) may also be used. Further, as described above, when DIW or DIW with a surfactant added thereto or the like is used to perform the rinse treatment, the rotational speed of the wafer (W) may be further increased to, for example, about 3000 rpm.

Second Embodiment

Figure 10:
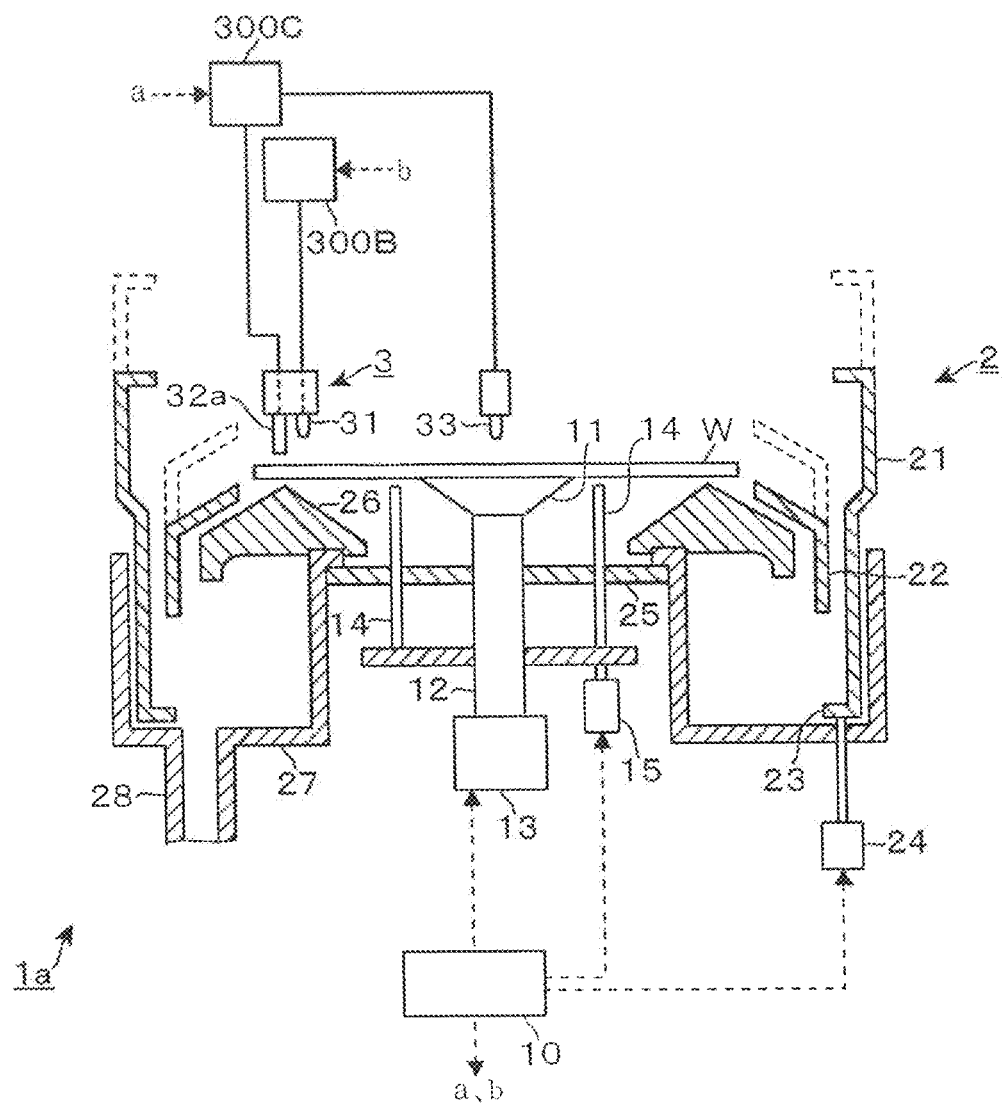
FIG. 10 is a vertical cross-sectional side view of a development apparatus according to a second embodiment.

A development apparatus (1a) according to a second embodiment is described with reference to FIGS. 10 and 11. The present development apparatus (1a) is structured as an apparatus that supplies a liquid developer to the wafer (W) to perform development processing, the wafer (W) having undergone exposure processing after application of a resist film. Here, the development apparatus (1a) includes structural elements that are common to the development apparatus 1 according to the first embodiment that is described using FIG. 2-6. Therefore, description about structures of the common elements is omitted. Further, the structural elements that are the same as those illustrated in FIG. 2-6 are indicated using the same reference numeral symbols.

The development apparatus (1a) includes a straight nozzle 33 for supplying a liquid developer (such as butyl acetate) to the center part of the rotating wafer (W). The straight nozzle 33 is provided so as to extend perpendicularly downward from a front end part of an arm 47, and a nozzle drive device 48 is connected to a base end side of the arm 47. The nozzle drive device 48 has a function of lifting and lowering the arm 47 and a function of moving the arm 47 along a guide rail 49 that horizontally extends. Due to the nozzle drive device 48, the straight nozzle 33 can move between a position above the wafer (W) that is held by the spin chuck 11 and a standby region 40 that is provided on an outer side of the cup body 2 and includes a nozzle bath. As illustrated in FIG. 10, the straight nozzle 33 is connected to a liquid developer supply source (300C) that is provided with a pump, a valve and the like.

The wafer (W) that has undergone development processing is subjected to a rinse treatment in which, for example, butyl acetate is used as a rinse liquid. However, in FIGS. 10 and 11, description about a structure related to the supply of the rinse liquid is omitted.

In the development processing in which a rinse treatment is performed after a liquid developer is supplied to the center part of the rotating wafer (W) and development has spread over the entire surface of the wafer (W), as illustrated by experimental results described below, there are cases where the development processing has not sufficiently proceeded in some regions in a peripheral part of the wafer (W).

Therefore, in the development apparatus (1a) of the present example, in addition to the above-described straight nozzle 33, an auxiliary liquid developer nozzle (32a) having a structure common to that described using FIG. 4-6 is used to perform once again the development processing for the peripheral part and thereby a uniform development processing within the surface of the wafer (W) is realized.

The auxiliary liquid developer nozzle (32a) is connected to the liquid developer supply source (300C), and is different from the first embodiment that includes the IPA nozzle 32 that supplies IPA (which is a liquid developer or a rinse liquid) in that the liquid developer that performs development of a resist film after exposure is supplied to the wafer (W).

On the other hand, various parameters that are common to the IPA nozzle 32 illustrated in the first embodiment may be used such as the angle (θ1) that is formed by a liquid developer discharged from the auxiliary liquid developer nozzle (32a) and the surface of the wafer (W) and the angle (θ2) that is formed by the tangential direction of the rotating wafer (W) and the liquid developer discharged toward the downstream side in the rotation direction of the wafer (W). Further, for the positioning of the nitrogen gas nozzle 31 relative to the nozzle head 3, the positional relation between the auxiliary liquid developer nozzle (32a) and the nitrogen gas nozzle 31, and the like, settings that are common to the example illustrated in the first embodiment can be used. In the present embodiment, it is also possible that the nitrogen gas nozzle 31 is not used.

The development processing that is performed using the development apparatus (1a) is described with reference to FIG. 12. First, the wafer (W) on which a resist film after exposure is formed is carried into the development apparatus 1 and is placed on the spin chuck 11. Next, the wafer (W) is rotated at a rotational speed in a range of 2000-3000 rpm; a liquid developer is supplied from the straight nozzle 33 toward the center part of the wafer (W) at a supply flow rate of 18 ml/minute in a range of 10-50 ml/minute; and the surface of the wafer (W) is covered by a liquid film (L) of the liquid developer (FIG. 12A).

Next, the supply of the liquid developer from the straight nozzle 33 is stopped; the straight nozzle 33 is retreated to the standby region 40, and the rotational speed of the wafer (W) is adjusted to a value in a range of 30-100 rpm; and the state in which the liquid film (L) of the liquid developer is formed on the surface of the wafer (W) is maintained. As a result, in a region covered by the liquid film (L) of the liquid developer, a portion of a resist solution after exposure is dissolved and removed, and the development processing is performed (FIG. 12B). After the development processing is so performed for a predetermined period of time, the rotational speed of the wafer (W) is increased to 100-1000 rpm, and a liquid developer containing a dissolved component is spun off from the wafer (W) and is discharged. As a result, the surface of the wafer (W) is in a state in which a thinner liquid film (L) of the liquid developer is formed or is in a dried state.

Thereafter, the nozzle head 3 is moved to a position above a peripheral part of the wafer (W) and the rotational speed of the wafer (W) is adjusted to 2000 rpm in a range of 1000-2500 rpm. Thereafter, a liquid developer is supplied from the auxiliary liquid developer nozzle (32a) at a discharge flow rate of 20 ml/minute in a range of 16-24 ml/minute (FIG. 12C). Then, in the peripheral part of the wafer (W) where the development processing is performed once again, the nozzle head 3 is moved from a position closer to the center part of the wafer (W) toward an outer peripheral side of the wafer (W). In a case where the range of the peripheral part of the wafer (W) where the development processing is performed once again is sufficiently narrow, it is also possible that the supply of the liquid developer is performed in a state in which the nozzle head 3 is not moved but is held stationary.

Butyl acetate or the like that is the liquid developer of the resist film also has a smaller surface tension as compared to pure water. Therefore, during the development processing of the peripheral part of the wafer (W), the tail (T) described using FIG. 9 is formed. When a large number of the dissolution products (P) remain on the surface of the wafer (W) due to the formation of the tail (T), there is a risk that the dissolution products (P) cannot be sufficiently removed even by subsequent rinsing.

Therefore, by using the auxiliary liquid developer nozzle (32a) of the present example, the liquid developer is once again supplied to the peripheral part of the wafer (W) while occurrence of liquid splashing is suppressed, and thereby the development processing is allowed to proceed in a region where the development is insufficient, and uniformity of development processing results in the surface can be improved.

After the nozzle head 3 is moved from the position closer to the center part of the wafer (W) in the peripheral region toward the outer peripheral side and the development processing is performed once again in this region, the discharge of the liquid developer from the auxiliary liquid developer nozzle (32a) is stopped and the nozzle head 3 is moved to the standby region 44. Then, a supply nozzle (not illustrated in the drawings) of a rinse liquid is moved to a position above the center part of the wafer (W), and a rinse treatment is performed by supplying the rinse liquid to the rotating wafer (W). Next, the supply of the rinse liquid to the wafer (W) is stopped, the rotation of the wafer (W) is continued to spin off the rinse liquid on the surface of the wafer (W), and the wafer (W) is dried and the processing in the development apparatus (1a) is completed (FIG. 12D).

As the liquid developer, in addition to the above-described butyl acetate, an organic solvent such as IPA may also be used. In this case, the discharge flow rate of the processing liquid from the auxiliary liquid developer nozzle (32a) is adjusted to a range of 16-24 ml/minute, which is the same as in the case of butyl acetate.

It is also possible that the above-described alkaline liquid developer is used as the liquid developer that is supplied from the auxiliary liquid developer nozzle (32a). It is also possible that the auxiliary liquid developer nozzle (32a) is used to perform the rinse treatment for the peripheral part of the wafer (W) and DIW or DIW with a surfactant added thereto is used as the rinse liquid. When these processing liquids are used, the discharge flow rate of the liquids from the nozzle (32a) is adjusted to a range of 10-50 ml/minute, for example.

In the above-described embodiment, an example is described in which supply of a nitrogen gas from the nitrogen gas nozzle 31 is not performed. However, it is also possible that the supply of a nitrogen gas from the nitrogen gas nozzle 31 is performed in accordance with the discharge of the processing liquid.

In the above-described embodiment, between supplying the liquid developer to the entire surface of the wafer (W) by the straight nozzle 33 and supplying once again the liquid developer to the peripheral part of the wafer (W) by the auxiliary liquid developer nozzle (32a), an operation is performed to spin off the liquid developer that is supplied early. However, this operation is not required. It is also possible that, after a predetermined period of time has elapsed since the liquid developer is supplied from the straight nozzle 33 to the entire surface of the wafer (W), the liquid developer is additionally supplied from the auxiliary liquid developer nozzle (32a) to the liquid film (L) of the liquid developer in the peripheral part of the wafer (W).

Further, in the development apparatuses (1, 1a) according to the first and second embodiments, examples are illustrated in which the processing liquid nozzles (the IPA nozzle 32 and the auxiliary liquid developer nozzle (32a)) and the gas nozzle (the nitrogen gas nozzle 31) are provided on the common nozzle head 3. However, it is of course also possible that the processing liquid nozzles (32, 32a) and the gas nozzle 31 are provided on separate nozzle heads and are driven by different moving mechanisms (the nozzle drive part 42).

EXAMPLES

Experiment 1

With respect to the wafer (W) that had undergone a heat treatment after the formation of the BCP film 93 and had undergone a UV treatment in a nitrogen atmosphere, the development processing and the rinse treatment were performed by using an IPA straight nozzle that discharges IPA downward in the vertical direction and by moving the IPA straight nozzle from the center side of the wafer (W) toward the periphery side of the wafer (W). In this case, the rotational speed of the wafer (W) at the point when the movement of the IPA straight nozzle was terminated was variously varied, and influence of the rotational speed of the wafer (W) on development defects was examined.

A. Experimental Conditions

Reference Example 1-1

IPA was supplied from the IPA straight nozzle to the wafer (W) at a flow rate of 18 ml/minute, the nozzle head 3 was moved at a moving speed of 6 mm/second, and the development processing was performed in a manner as described using FIG. 7A-7D. Supply of a nitrogen gas from the nitrogen gas nozzle 31 was not performed. The rotational speed of the wafer (W) at the start of the movement of the nozzle head 3 was 2500 rpm, and the rotational speed at the end of the movement was 1000 rpm.

Reference Example 1-2

The development processing was performed under the same conditions as Reference Example 1-1 except that the rotational speed of the wafer (W) at the start of the movement of the nozzle head 3 was 2500 rpm and the rotational speed at the end of the movement was 1300 rpm.

Reference Example 1-3

The development processing was performed under the same conditions as Reference Example 1-1 except that the rotational speed of the wafer (W) at the start of the movement of the nozzle head 3 was 2500 rpm and the rotational speed at the end of the movement was 1600 rpm.

B. Experimental Results

Figure 13A:
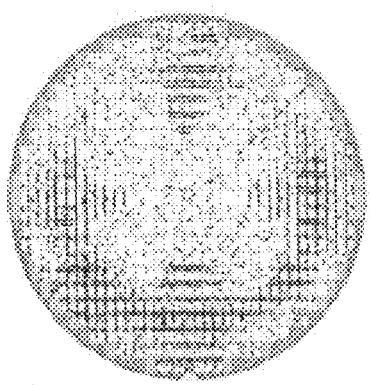
FIG. 13A-13C are development defect distribution diagrams illustrating a relation between a rotational speed of a wafer and development defects.
Figure 13B:
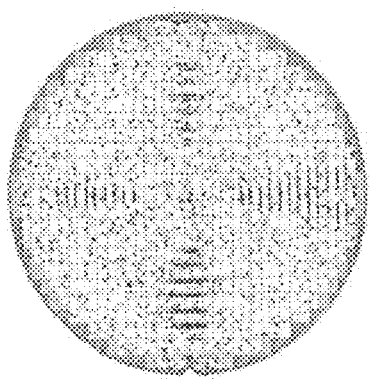
Figure 13C:
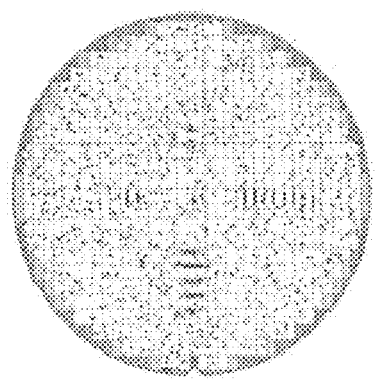

Experimental results of Reference Example 1-1-1-3 are illustrated in FIG. 13A-13C. FIG. 13A-13C each illustrate a distribution of development defects detected within the surface of the wafer (W) after the development processing. In each of FIG. 13A-13C, dots plotted within the surface of the wafer (W) indicate the development defects.

According to the results illustrated in FIG. 13A-13C, it is clear that the larger is the rotational speed during the development processing, the smaller is the number of the development defects occurring in the wafer (W) after the development processing. This is believed to be due to that, when the rotational speed of the wafer (W) is increased, the tail (T) that is described using FIG. 9 is shortened and it is suppressed that the dissolution products (P) generated during the development processing remain on the surface of the wafer (W).

Experiment 2

Parameters with which IPA is supplied from the IPA nozzle 32 were variously varied and occurrence of liquid splashing of the IPA supplied to the wafer (W) was examined.

A. Experimental Conditions

The rotational speed of the wafer (W) was 1000 rpm, and a position at which the IPA was supplied from the IPA nozzle 32 was fixed at a position 141 mm away from the center of the wafer (W) in the radial direction.

Parameter 2-1

The angle ($\theta 1$) formed by the IPA discharged from the IPA nozzle 32 and the surface of the wafer (W): 20 degrees, 30 degrees, 45 degrees.

Parameter 2-2

The opening diameter of the discharge port 321: 0.3 mm, 0.8 mm.

Parameter 2-3

The supply flow rate (flow speed) of the IPA: 10 ml/minute (2.5 m/second), 15 ml/minute (3.5 m/second), 20 ml/minute (4.7 m/second), 30 ml/minute (7.1 m/second), 40 ml/minute (9.4 m/second) when the opening diameter of the discharge port 321 is 0.3 mm; and 20 ml/minute (0.7 m/second), 30 ml/minute (1.0 m/second), 50 ml/minute (1.7 m/second), 75 ml/minute (2.5 m/second), 107 ml/minute (3.5 m/second) when the opening diameter of the discharge port 321 is 0.8 mm.

B. Experimental Results

FIGS. 14 and 15 illustrate liquid splashing evaluation results corresponding to combinations of the parameters. In FIGS. 14 and 15, a mark "O" is given to a combination of the parameters for which liquid splashing was not confirmed by visual inspection, and a mark "X" is given to a combination of the parameters for which liquid splashing was confirmed.

According to these tables, when the opening diameter of the discharge port 321 was 0.3 mm and the angle ($\theta 1$) formed by the IPA discharged from the IPA nozzle 32 and the surface of the wafer (W) was 20 degrees, in a widest flow rate range, liquid splashing did not occur and a good result was obtained.

Experiment 3

Under the condition of the combination of the parameters for which liquid splashing is less likely to occur in the experiment 2, the rotational speed of the wafer (W) and the supply flow rate (flow speed) of the IPA were variously varied and occurrence of liquid splashing of the IPA supplied to the wafer (W) was examined.

A. Experimental Conditions

The opening diameter of the discharge port 321 was 0.3 mm, the angle ($\theta 1$) formed by the IPA discharged from the IPA nozzle 32 and the surface of the wafer (W) was 20 degrees, and the position at which the IPA was supplied was fixed at a position 145 mm away from the center of the wafer (W) in the radial direction.

Parameter 3-1

The rotational speed of the wafer (W): 13 conditions from 600 rpm to 3000 rpm at an interval of 200 rpm.

Parameter 3-2

The IPA supply flow rate (linear speed of the wafer (W) in the tangential direction): 5 conditions from 16 ml/minute (3.9 m/second) to 24 ml/minute (5.5 m/second) at an interval of 2.0 ml/minute.

B. Experimental Results

FIG. 16 illustrates liquid splashing evaluation results corresponding to combinations of the parameters. An evaluation method using the marks "O" and "X" in the table of FIG. 16 is the same as in the case of FIGS. 14 and 15.

According to FIG. 16, when the IPA supply flow rate was in a range of 18.0-22.0 ml/minute, even when the rotational speed of the wafer (W) was increased to 2600 rpm, liquid splashing was not observed. Further, under the condition that the rotational speed of the wafer (W) was in a range of 800-2400 rpm (the linear speed was in a range of 12.1-36.4 m/second), for the IPA supply flow rate in the wide range of 16.0-22 ml/minute, liquid splashing was not observed. Further, when the rotational speed was in the range of 800-2000 rpm (the linear speed was in the range of 12.1-30.4 m/second), for all the conditions of the IPA supply flow rate, liquid splashing was not observed.

From these results, it is clear that, by adopting the parameters, such as that the opening diameter of the discharge port 321 is 0.3 mm and that the angle ($\theta 1$) formed by the IPA discharged from the IPA nozzle 32 and the surface of the wafer (W) is 20 degrees, occurrence of liquid splashing can be suppressed in a wide range.

Experiment 4

States of occurrence of development defects were compared between the case where the development processing and the rinse treatment were performed using the IPA nozzle 32 and the nitrogen gas nozzle 31 that are described using FIG. 4-6 and the case where the development processing and the rinse treatment were performed using the IPA straight nozzle.

A. Experimental Conditions

Example 4-1

The development processing and the rinse treatment were performed using the IPA nozzle 32 that was structured such that the opening diameter of the discharge port 321 was 0.3 mm and the angle (θ1) formed by the IPA discharged from the IPA nozzle 32 and the surface of the wafer (W) was 20 degrees. The supply flow rate of the liquid developer from the IPA nozzle 32 was 20 ml/minute; the rotational speed of the wafer (W) at the time when the supply of the IPA to the center part of the wafer (W) was started was 2500 rpm; and the rotational speed of the wafer (W) at the time when the IPA nozzle 32 reached the peripheral part of the wafer (W) was 2000 rpm. The moving speed of the nozzle head 3 was 4 mm/second. At the time when the nitrogen gas nozzle 31 reached the position above the center part of the wafer (W), supply of a nitrogen gas was started at a flow rate of 5 L/minute.

Comparative Example 4-1

The development processing and the rinse treatment were performed using an IPA straight nozzle that was structured such that the opening diameter of the discharge port 321 was 2 mm and the angle (θ1) formed by the IPA discharged from the IPA nozzle 32 and the surface of the wafer (W) was 90 degrees. The supply flow rate of the liquid developer from the IPA nozzle 32 was 50 ml/minute; to suppress occurrence of liquid splashing, the rotational speed of the wafer (W) at the time when the supply of the IPA to the center part of the wafer (W) was started was 1200 rpm; and the rotational speed of the wafer (W) at the time when the IPA nozzle 32 reached the peripheral part of the wafer (W) was 600 rpm. The moving speed of the nozzle head 3 was 2 mm/second. At the time when the nitrogen gas nozzle 31 reached the position above the center part of the wafer (W), supply of a nitrogen gas was started at a flow rate of 5 L/minute.

B. Experimental Results

Figure 17A:
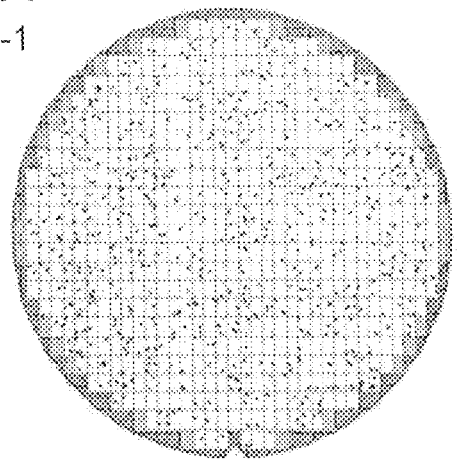
FIGS. 17A and 17B are development defect distribution diagrams illustrating results of an example and a comparative example.
Figure 17B:
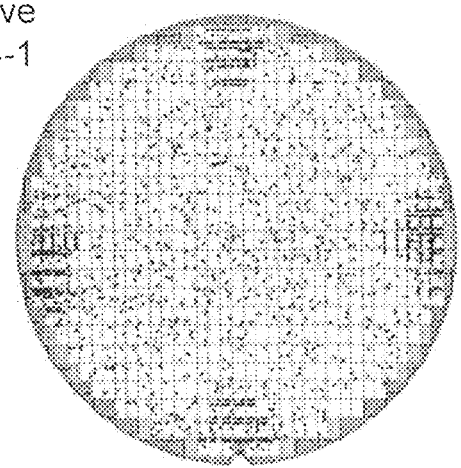

Experimental results of Example 4-1 and Comparative Example 4-1 are illustrated in FIGS. 17A and 17B. In each of FIGS. 17A and 17B, dots plotted within the surface of the wafer (W) indicate development defects, similar to the case of FIG. 13A-13C.

According to the results of Example 4-1 illustrated in FIG. 17A, the total number of the development defects is less as compared to Comparative Example 4-1 to be described below. Further, a tendency that development defects are concentrated in the peripheral part of the wafer (W) is resolved, the tendency being observed in the experimental results of Comparative Example 4-1 to be described below.

According to FIG. 17B that illustrates the results of Comparative Example 4-1, regions where development defects are concentrated are observed particularly in the peripheral part of the wafer (W). Further, even in a region where the development defects are dispersed, an average number of development defects per unit area is larger as compared to Example 4-1.

Comparing Example 4-1 and Comparative Example 4-1, the period of time from the start of the development processing to the end of the rinse treatment was 117 seconds in Comparative Example 4-1, and was 76 seconds in Example 4-1, which was reduced by about 35% relative to Comparative Example 4-1. Further there was a remarkable effect that the IPA consumption per one wafer (W) was 210 ml in Comparative Example 4-1, and was 26 ml in Example 4-1, which was reduced by about 88% relative to Comparative Example 4-1.

From the above, it is clear that good development processing and rinse treatment that result in less development defects can be executed by the development apparatus 1 that includes the IPA nozzle 32 that discharges a rinse liquid to the wafer (W) obliquely relative to the surface of the wafer (W) toward a downstream side in rotation direction of the wafer (W) and along the tangential direction of the wafer (W), and the nitrogen gas nozzle 31 that perpendicularly discharges a nitrogen gas to a position that is adjacent to the liquid landing position of the rinse liquid and is on the center side of the wafer (W).

Here, the angle (θ1) of the IPA from the IPA nozzle 32 relative to the surface of the wafer (W) is not limited to the case of being strictly adjusted to 20 degrees. It is clear that, even when the angle (θ1) is varied within a range of about ±4 degrees, occurrence of liquid splashing when the IPA lands on the wafer (W) can be sufficiently suppressed.

Experiment 5

Regarding the development processing according to the second embodiment, the amount of the liquid developer supplied from the straight nozzle 33 to the wafer (W) was varied, development processing of contact holes (CH) was performed, and distribution of deviations from an average CH diameter with respect to positions in the radial direction of the wafer (W) was examined.

A. Experimental Conditions

Reference Example 5-1

The rotational speed of the wafer (W) was 1500 rpm, and the development processing was performed by supplying a total of 20 ml of a liquid developer to the center part of the wafer (W).

Reference Example 5-2

The development processing was performed under the same conditions as Reference Example 5-1 except that the total supply amount of the liquid developer was 14 ml.

Reference Example 5-3

The development processing was performed under the same conditions as Reference Example 5-1 except that the total supply amount of the liquid developer was 7 ml.

B. Experimental Results

Experimental results of Reference Example 5-1-5-3 are illustrated in FIG. 18. A horizontal axis of FIG. 18 indicates a distance [mm] in the radial direction from the center of the wafer (W), and a vertical axis indicates a deviation [nm] from an average hole diameter of CHs having hole diameters less than 50 nm. A solid line illustrates a trend line of distribution of deviations according to Reference Example 5-1. Further, a dashed line and an one-dotted chain line respectively illustrate trend lines of distributions of deviations according to Reference Example 5-2 and 5-3.

According to the results illustrated in FIG. 18, as compared to the case where the supply amount of the liquid developer is small (Reference Example 5-3), by increasing the supply amount of the liquid developer, a degree of progress of the development within the surface of the wafer (W) can be increased on average. On the other hand, it is clear that a region on the periphery side, positioned more than about 135-140 mm from the center of the wafer (W), is a region where it is difficult for the development processing to sufficiently proceed even when the supply amount of the liquid developer is increased.

Experiment 6

Development processing was performed by supplying a liquid developer from the straight nozzle 33 to the wafer (W). With respect to the wafer (W) on which CHs were formed, development processing was performed by supplying once again a liquid developer to the peripheral part of the wafer (W) using the auxiliary liquid developer nozzle (32a) that was structured in the same way as the IPA nozzle 32 illustrated in FIG. 4-6.

A. Experimental Conditions

Reference Example 6-1

The development processing was performed using the IPA nozzle 32 that was structured such that the opening diameter of the discharge port 321 was 0.3 mm and the angle (θ1) formed by the liquid developer discharged from the IPA nozzle 32 and the surface of the wafer (W) was 20 degrees. The supply flow rate of the liquid developer from the auxiliary liquid developer nozzle (32a) was 20 ml/minute; the rotational speed of the wafer (W) was 1000 rpm; and the liquid developer was supplied for 10 seconds. Supply of a nitrogen gas from the nitrogen gas nozzle 31 was not performed.

Reference Example 6-2

The development processing was performed once again under the same conditions as Reference Example 6-1 except that the supply time of the liquid developer was 30 seconds.

Reference Example 6-3

The development processing was performed once again under the same conditions as Reference Example 6-1 except that the supply time of the liquid developer was 60 seconds.

Comparative Example 6-1

After the first development processing, development processing was not performed once again for the peripheral part of the wafer (W).

B. Experimental Results

Results of Reference Example 6-1-6-3 and Comparative Example 6-1 are illustrated in FIG. 19. A horizontal axis of FIG. 19 indicates a distance [mm] in the radial direction from the center of the wafer (W), and a vertical axis indicates a hole diameter (nm) of a CH. In FIG. 19, the results of Reference Example 6-1-6-3 are respectively plotted using white triangles, white diamonds and crosses, and the results of Comparative Example 6-1 are plotted using white squares.

According to the results illustrated in FIG. 19, by performing the development processing once again for the peripheral part of the wafer (W) using the auxiliary liquid developer nozzle (32a), as compared to Comparative Example 6-1 in which such processing was not performed, it was able to increase the hole diameters of CHs in all Reference Example 6-1-6-3. Further, by increasing the supply time of the liquid developer from 10 seconds (Reference Example 6-1) to 30 seconds (Reference Example 6-2), the hole diameter s of CHs were increased on average in the radial direction of the wafer (W). However, by further increasing the supply time of the liquid developer to 60 seconds (Reference Example 6-3), the hole diameters of the CHs remained almost unchanged.

From the above, it is clear that, by performing development processing once again for the peripheral part of the wafer (W) using the auxiliary liquid developer nozzle (32a), the degree of progress of the development on the periphery side can be adjusted and a uniform development processing within the surface of the wafer (W) can be executed. Further, it is also clear that, even when the supply amount of the liquid developer in performing once again the development processing is increased, it is possible that the effect eventually saturates.

In a manufacturing process of a semiconductor device, there is a process in which liquid processing is performed by supplying a processing liquid to a substrate while the substrate is rotated. Types of the liquid processing include development processing in which a substrate after exposure is developed, a cleaning treatment in which a surface of a substrate is cleaned, and the like. In performing such liquid processing, due to factors such fineness of a pattern and diversification of chemical solutions, it is possible that, depending on the type of the liquid processing, it is difficult to perform good liquid processing over an entire surface of a substrate. In particular, in a peripheral part of a substrate, since a linear speed is large, so-called liquid splashing is likely to occur in which a processing liquid is scattered to the outside, collides with a cup, and re-attaches to the substrate, and there is a concern that a device yield in the peripheral part of the substrate may be reduced.

The difficulty of liquid processing of a substrate, in addition to being due to factors such as the fineness of a pattern, is particularly large in liquid processing using a processing liquid such as an organic solvent that has a smaller surface tension as compared to pure water. In a method in which a film of a copolymer of two kinds of polymers that is formed on a substrate is heated and the two polymers are phase-separated and subsequently, by irradiating the film with ultraviolet light, one of the polymers is made soluble in an organic solvent, a pattern is formed by performing development processing by supplying the organic solvent to the substrate. However, when a dissolution product (reaction product) of the polymer dissolved in the liquid developer is removed from a surface of the substrate, it may be preferable to clean the substrate using the organic solvent.

In a method for cleaning a substrate, when a method is adopted in which a nozzle is moved from a center part of the substrate toward a peripheral part of the substrate while a cleaning liquid is discharged from the nozzle to the substrate, when an organic solvent such as IPA (isopropyl alcohol) is used, since the organic solvent has a small surface tension, it is difficult to clean the peripheral part of the substrate. That is, at an interface between an inner peripheral edge of a spiral liquid flow (liquid film) of the cleaning liquid (that is spreading toward an outer edge of the substrate) and the substrate, a so-called tail portion (tail), a thinner liquid film, is formed. However, when the surface tension of the liquid is small, it becomes impossible to control the interface. Therefore, in a region on the periphery side of the substrate where the liquid film becomes thin, a large number of dissolution products that are generated during development and are contained in the tail remain in particular in the peripheral part of the substrate and become development defects and thereby reduce the device yield.

Further, in a method in which a cleaning liquid nozzle and a gas nozzle are used in combination and a pushing force toward the outside due to discharge of a gas is acted on a liquid flow, when a highly volatile chemical solution such as IPA is used, volatilization of the tail is induced due to blowing of the gas, and thus dissolution products may remain in an unintended region. On the other hand, when the rotational speed of the substrate is increased, the tail is shortened and such a disadvantage can be avoided. However, as described above, in the peripheral part of the substrate, liquid splashing occurs, causing a problem of reattachment of particles.

In a liquid processing method according to one embodiment of the present invention, in performing liquid processing using a processing liquid with respect to an entire surface of a substrate while the substrate is rotated, liquid splashing of the processing liquid can be suppressed even when a rotational speed of the substrate is increased, and as a result, good liquid processing can be performed with respect to a peripheral part of the substrate.

A liquid processing method according to an embodiment of the present invention is a method in which a substrate is horizontally held by a rotatable substrate holding device and liquid processing is performed using a processing liquid with respect to an entire surface of the substrate, and includes:

a process in which the liquid processing is performed using the processing liquid with respect to at least a portion more on a center side than a peripheral part of the substrate;

a process in which, after the above process is performed, while the substrate is rotated, a discharge port of a processing liquid nozzle is positioned toward a downstream side in a rotation direction of the substrate as viewed from the discharge port and the processing liquid is discharged to the peripheral part of the substrate obliquely with respect to the surface of the substrate and along a tangential direction of the substrate; and a process in which, while the process in which the processing liquid is discharged to the peripheral part of the substrate, a gas is discharged from a gas nozzle perpendicularly toward a position that is adjacent to a liquid landing position of the processing liquid on the substrate and is on a center side of the substrate.

The liquid processing method may include the following processes.

(a) The process in which the processing liquid is discharged and the process in which the gas is discharged are processes that are performed while the processing liquid nozzle and the gas nozzle are moved from the center side of the substrate toward an outer periphery of the substrate.

(b) The process in which the processing liquid is discharged and the process in which the gas is discharged are processes in which the surface of the substrate is cleaned using a cleaning liquid. In this case, the cleaning process is a process for removing, from the surface of the substrate, a reaction product of a developed film and a liquid developer after the liquid developer is supplied to the entire surface of the substrate.

(c) The process in which the liquid processing is performed using the processing liquid with respect to at least a portion more on a center side than a peripheral part of the substrate is a process in which a liquid developer is supplied to the entire surface of the substrate. The process in which the processing liquid is discharged and the process in which the gas is discharged are processes in which a liquid developer is locally supplied to a peripheral part of the substrate.

(d) The processing liquid nozzle and the gas nozzle are provided on a common nozzle holding device that is freely movable by a moving mechanism.

(e) An angle formed by a discharge direction of the processing liquid discharged from the processing liquid nozzle and the surface of the substrate is in a range from 16 to 24 degrees. Further, a circumferential speed of the liquid landing position of processing liquid when the process in which the processing liquid is discharge and the process in which the gas is discharged are performed is 12-36 m/second. Further, a discharge flow rate of the processing liquid is 10-50 ml/minute.

(f) The processing liquid is an organic solvent.

In an embodiment of the present invention, when a processing liquid nozzle and a gas nozzle are used to perform liquid processing using a processing liquid with respect to an entire surface of a substrate while the substrate is rotated, attention is focused on a discharge direction of the processing liquid from the processing liquid nozzle, a liquid landing position of the processing liquid and an arrival position of a gas from the gas nozzle, and positional relations between the discharge direction of the processing liquid, the liquid landing position of the processing liquid and the arrival position of the gas are adjusted. Therefore, even when the rotational speed of the substrate is increased, liquid splashing of the processing liquid can be suppressed, and a good liquid processing for a peripheral part of the substrate can be performed.

Obviously, numerous modifications and variations of the present invention are possible in light of the above teachings. It is therefore to be understood that within the scope of the appended claims, the invention may be practiced otherwise than as specifically described herein.

What is claimed is:

1. A liquid processing method for liquid-processing a substrate, comprising:

setting a substrate on a substrate holding device configured to rotate the substrate while the substrate is held in a horizontal position;

supplying a processing liquid to a center portion of the substrate such that the center portion is liquid-processed;

positioning a discharge port of a processing liquid nozzle relative to a surface of the substrate and discharging the processing liquid from the discharge port onto the surface of the substrate while the substrate is rotated, wherein the discharge port of the processing liquid nozzle is angled such that the processing liquid is discharged from the discharge port at an oblique angle relative to the surface of the substrate, the processing liquid lands on the surface of the substrate at a landing point, the oblique angle is in a plane that is parallel or substantially parallel to a tangential line tangent to an edge of the substrate at an edge point, the edge point is located on a plane that includes the center of the substrate and the landing point, and the plane that includes the center of the substrate, the landing point, and the edge point is orthogonal to the surface of the substrate; and while the processing liquid is discharged from the discharge port, discharging a gas from a gas nozzle perpendicularly with respect to the surface of the substrate toward a position that is adjacent to the landing point, and wherein the position towards which the gas is discharged is closer to the center of the substrate than the landing point.

2. A liquid processing method for liquid-processing a substrate according to claim 1, wherein the positioning of the discharge port comprises moving the processing liquid nozzle from the center portion of the substrate toward a periphery of the substrate, and the discharging of the gas comprises moving the gas nozzle from the center portion of the substrate toward the periphery of the substrate.

3. A liquid processing method for liquid-processing a substrate according to claim 1, wherein the processing liquid is a cleaning liquid, and the positioning of the discharge port and the discharging of the gas comprise positioning the discharge port and discharging the gas such that the cleaning liquid cleans the surface of the substrate.

4. A liquid processing method for liquid-processing a substrate according to claim 3, wherein the positioning of the discharge port and the discharging of the gas comprise positioning the discharge port and discharging the gas such that the cleaning liquid removes a reaction product resulted from a reaction between a liquid developer and a film developed by the liquid developer.

5. A liquid processing method for liquid-processing a substrate according to claim 1, wherein the processing liquid is a liquid developer, the supplying of the processing liquid comprises supplying the liquid developer to the center portion of the substrate such that the liquid developer is supplied across the surface of the substrate, and the positioning of the discharge port and the discharging of the gas comprise positioning the discharge port and discharging the gas such that the liquid developer is supplied locally with respect to a periphery of the substrate.

6. A liquid processing method for liquid-processing a substrate according to claim 1, wherein the processing liquid nozzle and the gas nozzle are positioned on a nozzle holding device, and the positioning of the discharge port and the discharging of the gas comprise engaging a moving device configured to move the nozzle holding device such that the nozzle holding device is moved.

7. A liquid processing method for liquid-processing a substrate according to claim 1, wherein the positioning of the discharge port comprises setting the discharge nozzle such that a discharging direction of the processing liquid forms an angle in a range of 16 degrees to 24 degrees with respect to the surface of the substrate.

8. A liquid processing method for liquid-processing a substrate according to claim 1, wherein the positioning of the discharge port and the discharging of the gas comprise rotating the substrate such that a circumferential speed of a liquid landing position of the processing liquid is in a range of 12 m/second to 36 m/second.

9. A liquid processing method for liquid-processing a substrate according to claim 1, wherein the positioning of the discharge port comprises discharging the processing liquid at a discharge flow rate in a range of 10 ml/minute to 50 ml/minute.

10. A liquid processing method for liquid-processing a substrate according to claim 1, wherein the processing liquid is an organic solvent.

11. A liquid processing method for liquid-processing a substrate according to claim 2, wherein the processing liquid is a cleaning liquid, and the positioning of the discharge port and the discharging of the gas comprise positioning the discharge port and discharging the gas such that the cleaning liquid cleans the surface of the substrate.

12. A liquid processing method for liquid-processing a substrate according to claim 11, wherein the positioning of the discharge port and the discharging of the gas comprise positioning the discharge port and discharging the gas such that the cleaning liquid removes a reaction product resulted from a reaction between a liquid developer and a film developed by the liquid developer.

13. A liquid processing method for liquid-processing a substrate according to claim 2, wherein the processing liquid is a liquid developer, the supplying of the processing liquid comprises supplying the liquid developer to the center portion of the substrate such that the liquid developer is supplied across the surface of the substrate, and the positioning of the discharge port and the discharging of the gas comprise positioning the discharge port and discharging the gas such that the liquid developer is supplied locally with respect to a periphery of the substrate.

14. A liquid processing method for liquid-processing a substrate according to claim 2, wherein the processing liquid nozzle and the gas nozzle are positioned on a nozzle holding device, and the positioning of the discharge port and the discharging of the gas comprise engaging a moving device configured to move the nozzle holding device such that the nozzle holding device is moved.

15. A liquid processing method for liquid-processing a substrate according to claim 2, wherein the positioning of the discharge port comprises setting the discharge nozzle such that a discharging direction of the processing liquid forms an angle in a range of 16 degrees to 24 degrees with respect to the surface of the substrate.

* * * * *